(12) United States Patent
Millward

(10) Patent No.: US 8,956,713 B2
(45) Date of Patent: Feb. 17, 2015

(54) METHODS OF FORMING A STAMP AND A STAMP

(75) Inventor: Dan B. Millward, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/157,838

(22) Filed: Jun. 10, 2011

(65) Prior Publication Data

US 2011/0232515 A1 Sep. 29, 2011

Related U.S. Application Data

(62) Division of application No. 11/787,928, filed on Apr. 18, 2007, now Pat. No. 7,959,975.

(51) Int. Cl.
| B41K 1/42 | (2006.01) |
| B05D 5/00 | (2006.01) |
| G03F 7/00 | (2006.01) |
| B82Y 10/00 | (2011.01) |
| B82Y 40/00 | (2011.01) |

(52) U.S. Cl.
CPC ............... *G03F 7/0002* (2013.01); *B82Y 10/00* (2013.01); *B82Y 40/00* (2013.01)
USPC ........................................ 428/195.1; 101/333

(58) Field of Classification Search
USPC ...................................................... 428/195.1
See application file for complete search history.

(56) References Cited

U.S. PATENT DOCUMENTS

| 4,623,674 | A | 11/1986 | Bailey |
| 4,797,357 | A | 1/1989 | Mura et al. |
| 4,877,647 | A | 10/1989 | Klabunde |
| 5,328,810 | A | 7/1994 | Lowrey et al. |
| 5,374,367 | A | 12/1994 | Edamura et al. |
| 5,382,373 | A | 1/1995 | Carlson |
| 5,482,656 | A | 1/1996 | Hiraoka et al. |
| 5,512,131 | A | 4/1996 | Kumar et al. |
| 5,538,655 | A | 7/1996 | Fauteux et al. |
| 5,580,700 | A | 12/1996 | Rahman |
| 5,620,850 | A | 4/1997 | Bamdad et al. |
| 5,622,668 | A | 4/1997 | Thomas |
| 5,772,905 | A | 6/1998 | Chou |
| 5,834,583 | A | 11/1998 | Hancock et al. |
| 5,849,810 | A | 12/1998 | Müller |

(Continued)

FOREIGN PATENT DOCUMENTS

| CN | 1562730 A | 1/2005 |
| CN | 1799131 A | 7/2006 |

(Continued)

OTHER PUBLICATIONS

Huang et al., "Stretchable gold conductors on elastomeric substrates," Applied Physics Letters, vol. 82, No. 15, p. 2404.*

(Continued)

*Primary Examiner* — Mark Ruthkosky
*Assistant Examiner* — Ian Rummel
(74) *Attorney, Agent, or Firm* — TraskBritt

(57) ABSTRACT

A method of patterning a substrate is disclosed. An ink material is chemisorbed to at least one region of a stamp and the chemisorbed ink material is transferred to a receptor substrate. The ink material has greater chemical affinity for the receptor substrate than for the at least one region of the stamp. A method of forming the stamp is also disclosed, as are the stamp and a patterning system.

7 Claims, 7 Drawing Sheets

(56) References Cited

U.S. PATENT DOCUMENTS

| | | |
|---|---|---|
| 5,879,582 A | 3/1999 | Havelka et al. |
| 5,879,853 A | 3/1999 | Azuma |
| 5,891,356 A | 4/1999 | Inoue et al. |
| 5,904,824 A | 5/1999 | Oh et al. |
| 5,925,259 A | 7/1999 | Biebuyck et al. |
| 5,948,470 A | 9/1999 | Harrison et al. |
| 5,958,704 A | 9/1999 | Starzl et al. |
| 6,051,869 A | 4/2000 | Pan et al. |
| 6,111,323 A | 8/2000 | Carter et al. |
| 6,143,647 A | 11/2000 | Pan et al. |
| 6,153,495 A | 11/2000 | Kub et al. |
| 6,207,787 B1 | 3/2001 | Fahey et al. |
| 6,270,946 B1 | 8/2001 | Miller |
| 6,309,580 B1 | 10/2001 | Chou |
| 6,310,138 B1 | 10/2001 | Yonezawa et al. |
| 6,312,971 B1 | 11/2001 | Amundson et al. |
| 6,368,871 B1 | 4/2002 | Christel et al. |
| 6,403,382 B1 | 6/2002 | Zhu et al. |
| 6,414,164 B1 | 7/2002 | Afzali-Ardakani et al. |
| 6,423,465 B1 | 7/2002 | Hawker et al. |
| 6,423,474 B1 | 7/2002 | Holscher |
| 6,503,841 B1 | 1/2003 | Criscuolo et al. |
| 6,506,660 B2 | 1/2003 | Holmes et al. |
| 6,517,933 B1 | 2/2003 | Soane et al. |
| 6,518,194 B2 | 2/2003 | Winningham et al. |
| 6,537,920 B1 | 3/2003 | Krivokapic |
| 6,548,830 B1 | 4/2003 | Noguchi et al. |
| 6,565,763 B1 | 5/2003 | Asakawa et al. |
| 6,565,764 B2 | 5/2003 | Hiraoka et al. |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,592,764 B1 | 7/2003 | Stucky et al. |
| 6,630,520 B1 | 10/2003 | Bruza et al. |
| 6,635,912 B2 | 10/2003 | Ohkubo |
| 6,656,308 B2 | 12/2003 | Hougham et al. |
| 6,679,996 B1 | 1/2004 | Yao |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,767,693 B1 | 7/2004 | Okoroanyanwu |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross |
| 6,812,132 B2 | 11/2004 | Ramachandrarao et al. |
| 6,825,358 B2 | 11/2004 | Afzali-Ardakani et al. |
| 6,884,842 B2 | 4/2005 | Soane et al. |
| 6,887,332 B1 | 5/2005 | Kagan et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,911,400 B2 | 6/2005 | Colburn et al. |
| 6,913,697 B2 | 7/2005 | Lopez et al. |
| 6,924,341 B2 | 8/2005 | Mays et al. |
| 6,926,953 B2 | 8/2005 | Nealey et al. |
| 6,940,485 B2 | 9/2005 | Noolandi |
| 6,946,332 B2 | 9/2005 | Loo et al. |
| 6,949,456 B2 | 9/2005 | Kumar |
| 6,952,436 B2 | 10/2005 | Wirnsberger et al. |
| 6,957,608 B1 | 10/2005 | Hubert et al. |
| 6,962,823 B2 | 11/2005 | Empedocles et al. |
| 6,989,426 B2 | 1/2006 | Hu |
| 6,992,115 B2 | 1/2006 | Hawker et al. |
| 6,995,439 B1 | 2/2006 | Hill et al. |
| 6,998,152 B2 | 2/2006 | Uhlenbrock |
| 7,001,795 B2 | 2/2006 | Jiang et al. |
| 7,009,227 B2 | 3/2006 | Patrick et al. |
| 7,030,495 B2 | 4/2006 | Colburn et al. |
| 7,037,738 B2 | 5/2006 | Sugiyama et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,060,774 B2 | 6/2006 | Sparrowe et al. |
| 7,077,992 B2 | 7/2006 | Sreenivasan et al. |
| 7,087,267 B2 | 8/2006 | Breen et al. |
| 7,090,784 B2 | 8/2006 | Asakawa et al. |
| 7,112,617 B2 | 9/2006 | Kim et al. |
| 7,115,305 B2 | 10/2006 | Bronikowski et al. |
| 7,115,525 B2 | 10/2006 | Abatchev et al. |
| 7,115,995 B2 | 10/2006 | Wong |
| 7,118,784 B1 | 10/2006 | Xie |
| 7,119,321 B2 | 10/2006 | Quinlan |
| 7,132,370 B2 | 11/2006 | Paraschiv et al. |
| 7,135,144 B2 | 11/2006 | Christel et al. |
| 7,135,241 B2 | 11/2006 | Ferraris et al. |
| 7,135,388 B2 | 11/2006 | Ryu et al. |
| 7,135,523 B2 | 11/2006 | Ho et al. |
| 7,151,209 B2 | 12/2006 | Empedocles et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner et al. |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,202,308 B2 | 4/2007 | Boussand et al. |
| 7,208,836 B2 | 4/2007 | Manning |
| 7,252,791 B2 | 8/2007 | Wasserscheid et al. |
| 7,259,101 B2 | 8/2007 | Zurcher et al. |
| 7,279,396 B2 | 10/2007 | Derderian et al. |
| 7,282,240 B1 | 10/2007 | Jackman et al. |
| 7,291,284 B2 | 11/2007 | Mirkin et al. |
| 7,311,943 B2 | 12/2007 | Jacobson et al. |
| 7,326,514 B2 | 2/2008 | Dai et al. |
| 7,332,370 B2 | 2/2008 | Chang et al. |
| 7,332,627 B2 | 2/2008 | Chandross et al. |
| 7,338,275 B2 | 3/2008 | Choi et al. |
| 7,347,953 B2 | 3/2008 | Black et al. |
| 7,368,314 B2 | 5/2008 | Ufert |
| 7,407,887 B2 | 8/2008 | Guo |
| 7,408,186 B2 | 8/2008 | Merkulov et al. |
| 7,419,772 B2 | 9/2008 | Watkins et al. |
| 7,470,954 B2 | 12/2008 | Lee et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,569,855 B2 | 8/2009 | Lai |
| 7,585,741 B2 | 9/2009 | Manning |
| 7,592,247 B2 | 9/2009 | Yang et al. |
| 7,605,081 B2 | 10/2009 | Yang et al. |
| 7,632,544 B2 | 12/2009 | Ho et al. |
| 7,655,383 B2 | 2/2010 | Mela et al. |
| 7,658,773 B2 | 2/2010 | Pinnow |
| 7,700,157 B2 | 4/2010 | Bronikowski et al. |
| 7,723,009 B2 | 5/2010 | Sandhu et al. |
| 7,767,099 B2 | 8/2010 | Li et al. |
| 7,888,228 B2 | 2/2011 | Blanchard |
| 7,959,975 B2 | 6/2011 | Millward |
| 7,964,107 B2 | 6/2011 | Millward |
| 8,039,196 B2 | 10/2011 | Kim et al. |
| 8,080,615 B2 | 12/2011 | Millward |
| 8,083,953 B2 | 12/2011 | Millward et al. |
| 8,097,175 B2 | 1/2012 | Millward et al. |
| 8,101,261 B2 | 1/2012 | Millward et al. |
| 8,114,300 B2 | 2/2012 | Millward |
| 8,114,301 B2 | 2/2012 | Millward et al. |
| 8,294,139 B2 | 10/2012 | Marsh et al. |
| 8,372,295 B2 | 2/2013 | Millward |
| 8,394,483 B2 | 3/2013 | Millward |
| 8,404,124 B2 | 3/2013 | Millward et al. |
| 8,409,449 B2 | 4/2013 | Millward et al. |
| 8,425,982 B2 | 4/2013 | Regner |
| 8,426,313 B2 | 4/2013 | Millward et al. |
| 2001/0024768 A1 | 9/2001 | Matsuo et al. |
| 2001/0049195 A1 | 12/2001 | Chooi et al. |
| 2002/0055239 A1 | 5/2002 | Tuominen et al. |
| 2002/0084429 A1 | 7/2002 | Craighead et al. |
| 2002/0158342 A1 | 10/2002 | Tuominen et al. |
| 2002/0158432 A1 | 10/2002 | Wain |
| 2002/0167117 A1 | 11/2002 | Chou |

(56) References Cited

U.S. PATENT DOCUMENTS

| | | |
|---|---|---|
| 2003/0010241 A1* | 1/2003 | Fujihira et al. ............. 101/483 |
| 2003/0034329 A1 | 2/2003 | Chou |
| 2003/0068639 A1 | 4/2003 | Haneder et al. |
| 2003/0077452 A1 | 4/2003 | Guire et al. |
| 2003/0080471 A1 | 5/2003 | Chou |
| 2003/0080472 A1 | 5/2003 | Chou |
| 2003/0091752 A1 | 5/2003 | Nealey et al. |
| 2003/0100822 A1 | 5/2003 | Lew et al. |
| 2003/0108879 A1 | 6/2003 | Klaerner et al. |
| 2003/0143375 A1 | 7/2003 | Noguchi et al. |
| 2003/0157248 A1 | 8/2003 | Watkins et al. |
| 2003/0178707 A1 | 9/2003 | Abbott |
| 2003/0180522 A1 | 9/2003 | DeSimone et al. |
| 2003/0180966 A1 | 9/2003 | Abbott et al. |
| 2003/0185741 A1 | 10/2003 | Matyjaszewski |
| 2003/0196748 A1 | 10/2003 | Hougham et al. |
| 2003/0222048 A1 | 12/2003 | Asakawa et al. |
| 2003/0235930 A1 | 12/2003 | Bao et al. |
| 2004/0023287 A1 | 2/2004 | Harnack et al. |
| 2004/0028875 A1 | 2/2004 | Van Rijn et al. |
| 2004/0058059 A1 | 3/2004 | Linford et al. |
| 2004/0076757 A1* | 4/2004 | Jacobson et al. ............. 427/402 |
| 2004/0084298 A1 | 5/2004 | Yao et al. |
| 2004/0124092 A1 | 7/2004 | Black et al. |
| 2004/0125266 A1 | 7/2004 | Miyauchi et al. |
| 2004/0127001 A1 | 7/2004 | Colburn et al. |
| 2004/0142578 A1 | 7/2004 | Wiesner et al. |
| 2004/0159633 A1 | 8/2004 | Whitesides et al. |
| 2004/0163758 A1 | 8/2004 | Kagan et al. |
| 2004/0175628 A1 | 9/2004 | Nealey et al. |
| 2004/0192013 A1 | 9/2004 | Ryu et al. |
| 2004/0222415 A1 | 11/2004 | Chou et al. |
| 2004/0242688 A1 | 12/2004 | Chandross et al. |
| 2004/0254317 A1 | 12/2004 | Hu |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol et al. |
| 2005/0079486 A1 | 4/2005 | Abbott et al. |
| 2005/0100830 A1 | 5/2005 | Xu et al. |
| 2005/0120902 A1 | 6/2005 | Adams et al. |
| 2005/0124135 A1 | 6/2005 | Ayazi et al. |
| 2005/0133697 A1 | 6/2005 | Potyrailo et al. |
| 2005/0147841 A1 | 7/2005 | Tavkhelidze |
| 2005/0159293 A1 | 7/2005 | Wan et al. |
| 2005/0167651 A1 | 8/2005 | Merkulov et al. |
| 2005/0176256 A1 | 8/2005 | Kudelka |
| 2005/0208752 A1 | 9/2005 | Colburn et al. |
| 2005/0238889 A1 | 10/2005 | Iwamoto et al. |
| 2005/0238967 A1 | 10/2005 | Rogers et al. |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0024590 A1 | 2/2006 | Sandhu |
| 2006/0030495 A1 | 2/2006 | Gregg |
| 2006/0035387 A1 | 2/2006 | Wagner et al. |
| 2006/0038182 A1 | 2/2006 | Rogers et al. |
| 2006/0046079 A1 | 3/2006 | Lee et al. |
| 2006/0046480 A1 | 3/2006 | Guo |
| 2006/0046484 A1 | 3/2006 | Abatchev et al. |
| 2006/0060863 A1 | 3/2006 | Lu et al. |
| 2006/0062867 A1 | 3/2006 | Choi et al. |
| 2006/0078681 A1 | 4/2006 | Hieda et al. |
| 2006/0097134 A1 | 5/2006 | Rhodes |
| 2006/0105562 A1 | 5/2006 | Yi |
| 2006/0124467 A1 | 6/2006 | Ho et al. |
| 2006/0128165 A1 | 6/2006 | Theiss et al. |
| 2006/0134556 A1 | 6/2006 | Nealey et al. |
| 2006/0137554 A1 | 6/2006 | Kron et al. |
| 2006/0141222 A1 | 6/2006 | Fischer et al. |
| 2006/0141245 A1 | 6/2006 | Stellacci et al. |
| 2006/0154466 A1 | 7/2006 | Lee et al. |
| 2006/0163646 A1 | 7/2006 | Black et al. |
| 2006/0192283 A1 | 8/2006 | Benson |
| 2006/0205875 A1 | 9/2006 | Cha et al. |
| 2006/0211871 A1 | 9/2006 | Dai |
| 2006/0217285 A1 | 9/2006 | Destarac |
| 2006/0228635 A1 | 10/2006 | Suleski |
| 2006/0231525 A1 | 10/2006 | Asakawa et al. |
| 2006/0249784 A1 | 11/2006 | Black et al. |
| 2006/0249796 A1 | 11/2006 | Tavkhelidze |
| 2006/0254440 A1 | 11/2006 | Choi et al. |
| 2006/0255505 A1 | 11/2006 | Sandhu et al. |
| 2006/0257633 A1 | 11/2006 | Inoue et al. |
| 2006/0258159 A1 | 11/2006 | Colburn et al. |
| 2006/0278158 A1 | 12/2006 | Tolbert et al. |
| 2006/0281266 A1 | 12/2006 | Wells |
| 2006/0286305 A1 | 12/2006 | Thies et al. |
| 2006/0286490 A1 | 12/2006 | Sandhu et al. |
| 2006/0292777 A1 | 12/2006 | Dunbar |
| 2007/0020749 A1 | 1/2007 | Nealey et al. |
| 2007/0023247 A1 | 2/2007 | Ulicny et al. |
| 2007/0023805 A1 | 2/2007 | Wells et al. |
| 2007/0045562 A1 | 3/2007 | Parekh |
| 2007/0045642 A1 | 3/2007 | Li |
| 2007/0071881 A1 | 3/2007 | Chua et al. |
| 2007/0072403 A1 | 3/2007 | Sakata |
| 2007/0122749 A1 | 5/2007 | Fu et al. |
| 2007/0122932 A1 | 5/2007 | Kodas et al. |
| 2007/0138131 A1 | 6/2007 | Burdinski |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0183035 A1 | 8/2007 | Asakawa et al. |
| 2007/0194403 A1 | 8/2007 | Cannon et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0224823 A1 | 9/2007 | Sandhu |
| 2007/0227383 A1 | 10/2007 | Decre et al. |
| 2007/0249117 A1 | 10/2007 | Kang et al. |
| 2007/0272951 A1 | 11/2007 | Lieber et al. |
| 2007/0281220 A1 | 12/2007 | Sandhu et al. |
| 2007/0289943 A1 | 12/2007 | Lu et al. |
| 2007/0293041 A1 | 12/2007 | Yang |
| 2008/0032238 A1 | 2/2008 | Lu et al. |
| 2008/0038923 A1 | 2/2008 | Edelstein et al. |
| 2008/0041818 A1 | 2/2008 | Kihara et al. |
| 2008/0047930 A1 | 2/2008 | Blanchet et al. |
| 2008/0064217 A1 | 3/2008 | Horii |
| 2008/0073743 A1 | 3/2008 | Alizadeh et al. |
| 2008/0078999 A1 | 4/2008 | Lai |
| 2008/0083991 A1 | 4/2008 | Yang et al. |
| 2008/0085601 A1 | 4/2008 | Park et al. |
| 2008/0093743 A1 | 4/2008 | Yang et al. |
| 2008/0102252 A1 | 5/2008 | Black et al. |
| 2008/0103256 A1 | 5/2008 | Kim et al. |
| 2008/0113169 A1 | 5/2008 | Cha et al. |
| 2008/0164558 A1 | 7/2008 | Yang et al. |
| 2008/0174726 A1 | 7/2008 | Kim |
| 2008/0176767 A1 | 7/2008 | Millward |
| 2008/0193658 A1 | 8/2008 | Millward |
| 2008/0217292 A1 | 9/2008 | Millward et al. |
| 2008/0233297 A1 | 9/2008 | de Jong et al. |
| 2008/0233323 A1 | 9/2008 | Cheng et al. |
| 2008/0257187 A1 | 10/2008 | Millward |
| 2008/0260941 A1 | 10/2008 | Jin |
| 2008/0274413 A1 | 11/2008 | Millward |
| 2008/0286659 A1 | 11/2008 | Millward |
| 2008/0311347 A1 | 12/2008 | Millward et al. |
| 2008/0315270 A1 | 12/2008 | Marsh et al. |
| 2008/0318005 A1 | 12/2008 | Millward |
| 2009/0062470 A1 | 3/2009 | Millward et al. |
| 2009/0155579 A1 | 6/2009 | Greco et al. |
| 2009/0200646 A1 | 8/2009 | Millward et al. |
| 2009/0206489 A1 | 8/2009 | Li et al. |
| 2009/0212016 A1 | 8/2009 | Cheng et al. |
| 2009/0218567 A1 | 9/2009 | Mathew et al. |

(56) References Cited

U.S. PATENT DOCUMENTS

| | | |
|---|---|---|
| 2009/0236309 A1 | 9/2009 | Millward et al. |
| 2009/0240001 A1 | 9/2009 | Regner |
| 2009/0263628 A1 | 10/2009 | Millward |
| 2009/0267058 A1 | 10/2009 | Namdas et al. |
| 2009/0274887 A1 | 11/2009 | Millward et al. |
| 2009/0317540 A1 | 12/2009 | Sandhu et al. |
| 2010/0092873 A1 | 4/2010 | Sills et al. |
| 2010/0102415 A1 | 4/2010 | Millward et al. |
| 2010/0124826 A1 | 5/2010 | Millward et al. |
| 2010/0137496 A1 | 6/2010 | Millward et al. |
| 2010/0163180 A1 | 7/2010 | Millward |
| 2010/0204402 A1 | 8/2010 | Millward et al. |
| 2010/0279062 A1 | 11/2010 | Millward et al. |
| 2010/0316849 A1 | 12/2010 | Millward et al. |
| 2010/0323096 A1 | 12/2010 | Sills et al. |
| 2011/0232515 A1 | 9/2011 | Millward |
| 2012/0133017 A1 | 5/2012 | Millward et al. |
| 2012/0223053 A1 | 9/2012 | Millward et al. |

FOREIGN PATENT DOCUMENTS

| | | |
|---|---|---|
| CN | 101013662 A | 8/2007 |
| EP | 0784543 B1 | 4/2000 |
| EP | 1416303 A2 | 5/2004 |
| EP | 1906237 | 2/2008 |
| EP | 1593164 B1 | 6/2010 |
| JP | 11080414 A | 3/1999 |
| JP | 2003155365 | 5/2003 |
| JP | 2004335962 | 11/2004 |
| JP | 2005008882 A | 1/2005 |
| JP | 2005029779 | 3/2005 |
| JP | 2006036923 A | 2/2006 |
| JP | 2006055982 A | 3/2006 |
| JP | 2006110434 | 4/2006 |
| JP | 2007194175 | 8/2007 |
| JP | 2008036491 A | 2/2008 |
| KR | 1020060128378 | 12/2006 |
| KR | 20070029762 | 3/2007 |
| KR | 100771886 B1 | 11/2007 |
| TW | 200400990 | 3/1992 |
| TW | 200633925 | 10/1994 |
| TW | 200740602 | 1/1996 |
| TW | 584670 B | 4/2004 |
| TW | 200419017 | 10/2004 |
| TW | 200511364 | 3/2005 |
| TW | 256110 | 6/2006 |
| TW | I253456 | 11/2007 |
| TW | 200802421 | 1/2008 |
| WO | 9007575 | 7/1990 |
| WO | 9706013 A1 | 2/1997 |
| WO | 9839645 A1 | 9/1998 |
| WO | 9947570 | 9/1999 |
| WO | 9947570 A1 | 9/1999 |
| WO | 0031183 A1 | 6/2000 |
| WO | 0218080 | 3/2002 |
| WO | 02081372 A2 | 10/2002 |
| WO | 03045840 | 6/2003 |
| WO | 2005122285 A2 | 12/2005 |
| WO | 2006003592 | 1/2006 |
| WO | 2006003594 | 1/2006 |
| WO | 2006076016 A2 | 7/2006 |
| WO | 2006078952 A1 | 7/2006 |
| WO | 2006112887 | 10/2006 |
| WO | 2007001126 A1 | 1/2007 |
| WO | 2007024323 A2 | 1/2007 |
| WO | 2007013889 A2 | 2/2007 |
| WO | 2007024241 A2 | 3/2007 |
| WO | 2007019439 A3 | 5/2007 |
| WO | 2007055041 A1 | 5/2007 |
| WO | 2008055137 | 5/2008 |
| WO | 2008091741 A2 | 7/2008 |
| WO | 2008096335 A2 | 8/2008 |
| WO | 2008097736 A2 | 8/2008 |
| WO | 2008118635 A2 | 10/2008 |
| WO | 2008124219 A2 | 10/2008 |
| WO | 2008130847 A1 | 10/2008 |
| WO | 2008145268 A1 | 12/2008 |
| WO | 2008156977 A2 | 12/2008 |
| WO | 2009099924 A2 | 8/2009 |
| WO | 2009102551 A2 | 8/2009 |
| WO | 2009117238 A2 | 9/2009 |
| WO | 2009117243 A1 | 9/2009 |
| WO | 2009134635 A2 | 11/2009 |

OTHER PUBLICATIONS

Trimbach et al., "Block Copolymer Thermoplastic Elastomers for Microcontact Printing," Langmuir, 2003, vol. 19, p. 10957.*

Sohn et al., Fabrication of the Multilayered Nanostructure of Alternating Polymers and Gold Nanoparticles with Thin Films of Self-Assembling Diblock Copolymers, Chem, Mater, vol. 13, pp. 1752-1757 (2001).

Tadd et al, Spatial Distribution of Cobalt Nanoclusters in Block Copolymers, Langmuir, vol. 18, pp. 2378-2384 (2002).

Xia et al., An Approach to Lithographically Defined Self-Assembled Nanoparticle Films, Advanced Materials, vol. 18, pp. 930-933 (2006).

Xia, Younan, et al., "Soft Lithography," Annu. Rev. Mater. Sci., vol. 28, pp. 153-184, 1998.

Xu et al., Electric Field Alignment of Symmetric Diblock Copolymer Thin Films, Department of Polymer Science and Engineering, University of Massachusetts, 5 pages(2003).

Xu et al., Interfacial Interaction Dependence of Microdomain Orientation in Diblock Copolymer Thin Films, Macromolecules, vol. 38, pp. 2802-2805 (2005).

Xu, F.J., et al., "Surface-Initiated Atom Transfer Radical Polymerization from Halogen-Terminated Si(111) (Si-X, X=Cl, Br) Surfaces for the Preparation of Well-Defined Polymer-Si Hybrids," Langmuir, vol. 21, No. 8, pp. 3221-3225, 2005.

Yamaguchi et al., Resist-Pattern Guided Self-Assembly of Symmetric Diblock Copolymer, Journal of Photopolymer Science and Technology, vol. 19, No. 3, pp. 385-388 (2006).

Yang et al., Covalently Attached Graft Polymer Monolayer on Organic Polymeric Substrate via Confined Surface Inhibition Reaction, Journal of Polymer Science—A—Polymer Chemistry Edition, Sep. 28, 2006, pp. 745-755, vol. 45, Issue 5.

Yu et al., Contact Printing Beyond Surface Roughness: Liquid Supramolecular Nanostamping, Advanced Materials, vol. 19, 2007, pp. 4338-4342.

Zaumseil et al., "Three-Dimensional and Multilayer Nanostructures Formed by Nanotransfer Printing," Nano Letters, 2003, vol. 3, No. 9, pp. 1223-1227.

Zehner, Robert W., et al., "Selective Decoration of a Phase-Separated Diblock Copolymer with Thiol-Passivated Gold Nanocrystals," Langmuir, vol. 14, No. 2, pp. 241-243, Jan. 20, 1998.

Zhang et al., "Self-Assembled Monolayers of Terminal Alkynes on Gold," J. Am. Chem. Soc., vol. 129, No. 16, pp. 4876-4877, 2007.

Zhao et al., Colloidal Subwavelength Nanostructures for Antireflection Optical Coatings, Optics Letters, vol. 30, No. 14, pp. 1885-1887 (2005).

Zhou et al., Nanoscale Metal/Self-Assembled Monolayer/Metal Heterostructures, American Institute of Physics, pp. 611-613 (1997).

Zhu, X.Y., et al., "Grafting of High-Density Poly(Ethylene Glycol) Monolayers on Si(111)," Langmuir, vol. 17, pp. 7798-7803, 2001.

Zhu, X.Y., et al., "Molecular Assemblies on Silicon Surfaces via Si—O Linkages," Langmuir, vol. 16, pp. 6766-6772, 2000.

Asakawa et al., Fabrication of Subwavelength Structure for Improvement in Light-Extraction Efficiency of Light-Emitting Devices Using a Self-Assembled Pattern of Block Copolymer, http://www.research.ibm.com/journal/rd/515/black.html, IBM Journal of Research and Development, vol. 51, No. 5, 2007.

Black et al., Polymer Self Assembly in Semiconductor Microelectronics, IBM J. Res. & Dev. vol. 51, No. 5, Sep. 2007, pp. 605-633.

Black, C.T., "Self-aligned self-assembly of multi-nanowire silicon field effect transistors," Appl. Phys. Lett., vol. 87, pp. 163116-1 through 163116-3, 2005.

(56) References Cited

OTHER PUBLICATIONS

Black, Charles T., et al., "Nanometer-Scale Pattern Registration and Alignment by Directed Diblock Copolymer Self-Assembly," IEEE Transactions on Nanotechnology, vol. 3, No. 3, pp. 412-415, Sep. 2004.
Cha et al., Biomimetic Approaches for Fabricating High-Density Nanopatterned Arrays, Chem. Mater. vol. 19, 2007, pp. 839-843.
Chai et al., Assembly of Aligned Linear Metallic Patterns on Silicon, Nature Nanotechnology, vol. 2, Aug. 2007, pp. 500-506.
Chai et al., Using Cylindrical Domains of Block Copolymers to Self-Assemble and Align Metallic Nanowires, American Chemical Society, www.Acsnano.org, 2008. pp. A-K.
Chen et al., Highly Ordered Arrays of Mesoporous Silica Nanorods with Tunable Aspect Ratios from Block Copolymer Thin Films, Advanced Materials, vol. 20, pp. 763-767, 2008.
Cho et al., Nanoporous Block Copolymer Micelle/Micelle Multilayer Films with Dual Optical Properties, J. Am. Chem. Soc., vol. 128, No. 30, pp. 9935-9942 (2006).
Clark et al., "Selective Deposition in Multilayer Assembly: SAMs as Molecular Templates," Supramolecular Science, vol. 4, pp. 141-146, (1997).
Erlandsson, Mikael, et al., "Metallic Zinc Reduction of Disulfide Bonds between Cysteine Residues in Peptides and Proteins," International Journal of Peptide Research and Therapeutics, vol. 11, No. 4, pp. 261-265, Dec. 2005.
Fasolka et al., Block Copolymer Thin Films: Physics and Applications1, Annual Review, vol. 31, pp. 323-355 (2001).
Gates, "Nanofabrication with Molds and Stamps," Materials Today, pp. 44-49, (Feb. 2005).
Grubbs, Hybrid Metal-Polymer Composites from Functional Block Copolymers, Journal of Polymer Science: Part A: Polymer Chemistry, vol. 43, pp. 4323-4336 (2005).
Guarini et al., Nanoscale Patterning Using Self-Assembled Polymers for Semiconductor Applications, J. Vac. Sci. Technol. B 19(6), pp. 2784-2788, Nov./Dec. (2001).
Hadziioannou, Semiconductor Block Copolymers for Self-Assembled Photovoltaic Devices, MRS Bulletin, pp. 456-460 (2002).
Hamers, Robert J., "Passivation and activation: How do monovalent atoms modify the reactivity of silicon surfaces? A perspective on the article, 'The mechanism of amine formation on Si(100) activated with chlorine atoms,'" Surface Science, vol. 600, pp. 3361-3362, 2006.
Hayward et al., Crosslinked Poly(styrene)-block-Poly(2-vinylpyridine) Thin Films as Swellable Templates for Mesostructured Silica and Titania, Advanced Materials, vol. 17, 2005, pp. 2591-2595.
Helmuth, Jo A., et al., "High-Speed Microcontact Printing," J. Am. Chem. Soc., vol. 128, No. 29, pp. 9296-9297, 2006.
Horiuchi et al., Three-Dimensional Nanoscale Alignment of Metal Nanoparticles Using Block Copolymer Films as Nanoreactors, Langmuir, vol. 19, pp. 2963-2973 (2003).
Huang et al., "Using Surface Active Random Copolymers to Control the Domain Orientation in Diblock Copolymer Thin Films," Macromolecules, 1998, 31, 7641-7650.
Hur et al., "Nanotransfer printing by use of noncovalent surface forces: Applications to thin-film transistors that use single-walled carbon nanotube networks and semiconducting polymers," Applied Physics Letters, vol. 85, No. 23, Dec. 6, 2004, pp. 5730-5732.
International Search Report for International Application No. PCT/US2009/062117 dated Jun. 1, 2010, 3 pages.
International Written Opinion of the International Searching Authority for International Application No. PCT/US2009/062117 dated Jun. 1, 2010, 3 pages.
International Search Report for International Application No. PCT/US2008/060520, dated Sep. 11, 2008, 4 pages.
Ji et al., Molecular Transfer Printing Using Block Copolymers, ACS Nano, vol. 4, No. 2, pp. 599-609, 2010.

Jiang, Xingyu, et al., "Electrochemical Desorption of Self-Assembled Monolayers Noninvasively Releases Patterned Cells from Geometrical Confinements," J. Am. Chem. Soc., vol. 125, No. 9, pp. 2366-2367, 2003.
Johnson, Daniel L., et al., "Probing the stability of the disulfide radical intermediate of thioredoxin using direct electrochemistry," Letters in Peptide Science, vol. 10, pp. 495-500, 2003.
Jun, Yongseok, et al., "Patterning protein molecules on poly(ethylene glycol) coated Si(111)," Biomaterials, vol. 25, pp. 3503-3509, 2004.
Kavakli et al., Single and Double-Layer Antireflection Coatings on Silicon, Turk J Phys, vol. 26, pp. 349-354 (2002).
Krishnamoorthy et al., Block Copolymer Micelles as Switchable Templates for Nanofabrication, Languir, vol. 22, No. 8, Mar. 17, 2006, pp. 3450-3452.
Li, Yong, et al., "A Method for Patterning Multiple Types of Cells by Using Electrochemical Desorption of Self-Assembled Monolayers within Microfluidic Channels," Angew. Chem. Int. Ed., vol. 46, pp. 1094-1096, 2007.
Liu et al., Pattern Transfer Using Poly(styrene-block-methyl methacrylate) Copolymer Films and Reactive Ion Etching, J. Vac. Sci. Technol. B vol. 25, No. 6, Nov./Dec. 2007, pp. 1963-1968.
Loo et al., "Additive, nanoscale patterning of metal films with a stamp and a surface chemistry mediated transfer process: Applications in plastic electronics," Applied Physics Letters, vol. 81, No. 3, Jul. 15, 2002, pp. 562-564.
Lopes et al., Hierarchical Self-Assembly of Metal Nanostructures on Diblock Copolymer Scaffolds, Nature, vol. 414, Dec. 13, 2001, pp. 735-738.
Lutz, Jean-Francois, "1,3-Dipolar Cycloadditions of Azides and Alkynes: A Universal Ligation Tool in Polymer and Materials Science," Angew. Chem. Int. Ed., vol. 46, pp. 1018-1025, 2007.
Malenfant et al., Self-Assembly of an Organic-Inorganic Block Copolymer for Nano-Ordered Ceramics, Nature Nanotechnology, vol. 2, pp. 43-46 (2007).
Niu, Sanjun, et al., "Selective assembly of nanoparticles on block copolymer by surface modification," Nanotechnology, vol. 18, pp. 1-4, 2007.
Park et al., Fabrication of Highly Ordered Silicon Oxide Dots and Stripes from Block Copolymer Thin Films, Advanced Materials, vol. 20, pp. 681-685, 2008.
Park et al., High-Aspect-Ratio Cylindrical Nanopore Arrays and Their Use for Templating Titania Nanoposts, Advanced Materials, vol. 20, pp. 738-742, 2008.
Park et al., Directed Assembly of Lamellae-Forming Block Copolymers by Using Chemically and Topographically Patterned Substrates. Advanced Materials, 19: 607-611. doi: 10.1002/adma.200601421 (2007).
Reed, M.A., et al., "Molecular random access memory cell," Appl. Phys. Lett., vol. 78, No. 23, pp. 3735-3737, Jun. 2001.
Rozkiewicz, Dorota I., et al., "'Click' Chemistry by Microcontact Printing," Angew. Chem. Int. Ed., vol. 45, pp. 5292-5296, 2006.
Ruiz, R., et al., "Induced Orientational Order in Symmetric Diblock Copolymer Thin-Films," submitted to Advanced Materials, 12 pages, no date.
Sato et al., Novel Antireflective Layer Using Polysilane for Deep Ultraviolet Lithography, J. Vac. Sci. Technol. B, vol. 17, No. 6, pp. 3398-3401 (1999).
Park, Sung Chan, et al., "Controlled Ordering of Block Copolymer Thin Films by the Addition of Hydrophilic Nanoparticles," Macromolecules 2007, vol. 40, No. 22, American Chemical Society, pp. 8119-8124.
Peng, J., et. al., "Development of Nanodomain and Fractal Morphologies in Solvent Annealed Block copolymer Thin Films," Macromol. Rapid Commun. 2007, 28, pp. 1422-1428.
Peters, R. D., et al., "Combining Advanced Lithographic Techniques and Self-assembly of Thin Films of Diblock Copolymers to Produce Templates for Nanofabrication," J. Vac. Sci. Technol. B, vol. 18, No. 6, Nov./Dec. 2000, American Vacuum Society, pp. 3530-3532.
Peters, R. D., et al., "Morphology of Thin Films of Diblock Copolymers on Surfaces Micropatterned with Regions of Different Interfacial Energy," Macromolecules, vol. 35, No. 5, 2002, American Chemical Society, pp. 1822-1834.

(56) References Cited

OTHER PUBLICATIONS

Potemkin, Igor I., et al., "Effect of the Molecular Weight of AB Diblock Copolymers on the Lamellar Orientation in Thin Films: Theory and Experiment," Macromol. Rapid Commun., 2007, 28, pp. 579-584.

Resnick, D. J., et al., "Initial Study of the Fabrication of Step and Flash Imprint Lithography Templates for the Printing of Contact Holes," Microlith., Microfab., Microsyst., vol. 3, No. 2, Apr. 2004, Society of Photo-Optical Instrumentation Engineers, pp. 316-321.

Rogers, J. A., "Slice and Dice, Peel and Stick: Emerging Methods for Nanostructure Fabrication," ACS Nano, vol. 1, No. 3, 2007, pp. 151-153.

Ruiz, R., et al., "Density Multiplication and Improved Lithography by Directed Block Copolymer Assembly," Science, vol. 321, Aug. 15, 2008, pp. 936-939.

Ryu, Du Yeol, et al., "Surface Modification with Cross-Linked Random Copolymers: Minimum Effective Thickness," Macromolecules, vol. 40, No. 12, 2007, American Chemical Society, pp. 4296-4300.

Sang et al., "Epitaxial self-assembly of block copolymers on lithographically defined nanopatterned substrates", Nature, vol. 24, pp. 411-414, (Jul. 2003).

Saraf, Ravi R., et al., "Spontaneous Planarization of Nanoscale Phase Separated Thin Film," Applied Physics Letters, vol. 80, No. 23, Jun. 10, 2002, American Institute of Physics, pp. 4425-4427.

Sawhney, A. S., et al., "Bioerodible Hydrogels Based on Photopolymerized Poly(ethylene glycol)-co-poly(a-hydroxy acid) Diacrylate Macromers," Macromolecules 1993, 26, American Chemical Society, pp. 581-587, Abstract only.

Segalman, R. A., "Patterning with Block Copolymer Thin Films," Materials Science and Engineering R 48 (2005), Elsevier B. V., pp. 191-226.

Shahrjerdi, D., et al., "Fabrication of Ni Nanocrystal Flash Memories Using a Polymeric Self-Assembly Approach," IEEE Electron Device Letters, vol. 28, No. 9, Sep. 2007, pp. 793-796.

Sharma, S. et al., "Ultrathin Poly(ethylene glycol) Films for Silicon-based Microdevices," Applied Surface Science, 206 (2003), Elsevier Science B.V., pp. 218-229.

Sigma-Aldrich, 312-315Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.

Sivaniah, E., et al., "Observation of Perpendicular Orientation in Symmetric Diblock Copolymer Thin Films on Rough Substrates," Macromolecules 2003, 36, American Chemical Society, pp. 5894-5896.

Sivaniah, et al., "Symmetric Diblock Copolymer Thin Films on Rough Substrates, Kinetics and Structure Formation in Pure Block Copolymer Thin Films," Macromolecules 2005, 38, American Chemical Society, pp. 1837-1849.

Solak, H. H., "Nanolithography with Coherent Extreme Ultraviolet Light," Journal of Physics D: Applied Physics, 2006, IOP Publishing Ltd., UK, pp. R171-R188.

Srinvivasan, C., et al., "Scanning Electron Microscopy of Nanoscale Chemical Patterns," ACS Nano, vol. 1, No. 3, pp. 191-201, 2007.

Stoykovich, M. P., et al., "Directed Assembly of Block Copolymer Blends into Nonregular Device-Oriented Structures," Science, vol. 308, Jun. 3, 2005, pp. 1442-1446.

Stoykovich, M. P., et al., "Directed Self-Assembly of Block Copolymers for Nanolithography: Fabrication of Isolated Features and Essential Integrated Circuit Geometries," ACS Nano, vol. 1, No. 3, 2007, pp. 168-175.

Sundrani, D., et al., "Guiding Polymers to Perfection: Macroscopic Alignment of Nanoscale Domains," Nano Lett., vol. 4, No. 2, 2004, American Chemical Society, pp. 273-276.

Sundrani, D., et al., "Hierarchical Assembly and Compliance of Aligned Nanoscale Polymer Cylinders in Confinement," Langmuir 2004, vol. 20, No. 12, 2004, American Chemical Society, pp. 5091-5099.

Tang et al., Evolution of Block Copolymer Lithography to Highly Ordered Square Arrays, Science, vol. 322, No. 5900, Sep. 25, 2008, pp. 429-432.

Truskett, V. M., et. al., "Trends in Imprint Lithography for Biological Applications," Trends in Biotechnology, vol. 24, No. 7, Jul. 2006, pp. 312-315.

Tseng et al, Enhanced Block Copolymer Lithography Using Sequential Infiltration Synthesis, The Journal of Physical Chemistry, vol. 115, No. 36, Sep. 15, 2011, 15 pages.

Van Poll, M. L., et al., "Self-Assembly Approach to Chemical Micropatterning of Poly(dimethylsiloxane)," Angew. Chem. Int. Ed. 2007, 46, pp. 6634-6637.

Wang, C., et al., "One Step Fabrication and characterization of Platinum Nanopore Electrode Ensembles formed via Amphiphilic Block Copolymer Self-assembly," Electrochimica Acta 52 (2006), pp. 704-709.

Wathier, M., et al., "Dendritic Macromers as in Situ Polymerizing Biomaterials for Securing Cataract Incisions," J. Am. Chem. Soc., 2004, 126 (40), pp. 12744-12745, Abstract only.

Winesett, D.A., et al., "Tuning Substrate Surface Energies for Blends of Polystyrene and Poly(methyl methacrylate)," Langmuir 2003, 19, American Chemical Society, pp. 8526-8535.

WIPF, "Handbook of Reagents for Organic Synthesis", 2005, John Wiley & Sons Ltd., p. 320.

Wu, C.Y., et al., "Self-Assembled Two-Dimensional Block Copolymers on Pre-patterned Templates with Laser Interference Lithography," IEEE, 2007, pp. 153-154.

Xiao, Shuaigang., et al., "Graphoepitaxy of Cylinder-forming Block Copolymers for Use as Templates to Pattern Magnetic Metal Dot Arrays," Nanotechnology 16, IPO Publishing Ltd, UK (2005), pp. S324-S329.

Xu, Ting, et al., "The Influence of Molecular Weight on Nanoporous Polymer Films," Polymer 42, Elsevier Science Ltd., (2001) pp. 9091-9095.

Yamaguchi, T., et al., "Resist-Pattern Guided Self-Assembly of Symmetric Diblock Copolymer," Journal of Photopolymer Science and Technology, vol. 19, No. 3, pp. 385-388 (2006).

Yamaguchi, Toru, et al., "Two-dimensional Arrangement of Vertically Oriented Cylindrical Domains of Diblock Copolymers Using Graphoepitaxy with Artificial Guiding Pattern Layout," Microprocesses and Nanotechnology, 2007, Conference date Nov. 5-8, 2007, pp. 434-435.

Yan, Xiaohu, et al., "Preparation and Phase Segregation of Block Copolymer Nanotube Multiblocks," J. Am. Chem. Soc., vol. 126, No. 32, 2004, American Chemical Society, pp. 10059-10066.

Yang, Xiao M., et al., "Guided Self-Assembly of Symmetric Diblock Copolymer Films on Chemically Nanopatterned Substrates," Macromolecules 2000, vol. 33, No. 26, 2000, American Chemical Society, pp. 9575-9582.

Yang, Xiaomin, et al., "Nanoscopic Templates Using Self-assembled Cylindrical Diblock Copolymers for Patterned Media," J. Vac. Sci. Technol. B 22(6), Nov./Dec. 2004, American Vacuum Society, pp. 3331-3334.

Yurt, Serkan, et al., "Scission of Diblock Copolymers into Their Constituent Blocks," Macromolecules 2006, vol. 39, No. 5, 2006, American Chemical Society, pp. 1670-1672.

Zhang, Mingfu, et al., "Highly Ordered Nanoporous Thin Films from Cleavable Polystyrene-block-poly(ethylene oxide),"Adv. Mater. 2007, 19, pp. 1571-1576.

Zhang, Yuan, et al., "Phase Change Nanodot Arrays Fabricated Using a Self-Assembly Diblock Copolymer Approach," Applied Physics Letter, 91, 013104, 2007, American Institute of Physics, pp. 013104 to 013104-3.

Ali, H. A., et al., Properties of Self-assembled ZnO Nanostructures, Solid-State Electronics 46 (2002), 1639-1642.

Arshady, R., et al., "The Introduction of Chloromethyl Groups into Styrene-based Polymers, 1," Makromol. Chem., vol. 177, 1976, p. 2911-2918.

Bae, Joonwon, "Surface Modification Using Photo-Crosslinkable Random Copolymers", Abstract submitted for the Mar. 2006 meeting of the American Physical Society, submitted Nov. 30, 2005. (Accessed via the Internet [retrieved on Apr. 5, 2010], URL: http://absimage.aps.org/image/MWS_MAR06-2005-003641.pdf).

(56) References Cited

OTHER PUBLICATIONS

Balsara, C., et al, CPIMA, IRG Technical Programs, Synthesis and application of Nanostructured Materials, Leland Stanford Junior Univ., 2006, http://www.stanford.edu/group/cpima/irg/irg_1.htm, printed Jul. 1, 2009.
Bang, J., "The Effect of Humidity on the Ordering of Tri-block Copolymer Thin Films," Abstract submitted for the Mar. 2007 meeting of The American Physical Society, submitted Nov. 20, 2006.
Bass, R. B., et al., "Microcontact Printing with Octadecanethiol", Applied Surface Science, 226(4), pp. 335-340, Apr. 2004, http://www.ece.virginia.edu/UVML/sis/Papers/rbbpapers/assoct.pdf.
Bearinger, J. P., et al., "Chemisorbed Poly(propylene sulphide)-based Copolymers Resist Biomolecular Interactions," Nature Materials 2, 259-264, 2003, (published online Mar. 23, 2003). Published online Mar. 23, 2003.
Berry, B. C., et al., "Orientational Order in Block Copolymer Films Zone Annealed Below the Order-Disorder Transition Temperature," Nano Letters vol. 7, No. 9 Aug. 2007, Polymers Division, Nat'l. Inst. of Standards and Technology, Maryland, USA, pp. 2789-2794, (published on Web Aug. 11, 2007).
Berry, B. C., et al., "Effects of Zone Annealing on Thin Films of Block Copolymers", National Institute of Standard and Technology, Polymers Division, Maryland, USA, 2007, 2 pages.
Black et al., Integration of Self-Assembled Diblock Copolymers for Semiconductor Capacitor Fabrication, Applied Physics Letters, vol. 79, No. 3, pp. 409-411 (2001).
Black, C. T., "Polymer Self-Assembly as a Novel Extension to Optical Lithography," ACSNano, vol. 1, No. 3, 2007, American Chemical Society, pp. 147-150.
Black, C. T., et al., "High-Capacity, Self-Assembled Metal-Oxide-Semiconductor Decoupling Capacitors," IEEE Electron Device Letters, vol. 25, No. 9, Sep. 2004, pp. 622-624.
Black, C. T., et al., "Self Assembly in Semiconductor Microelectronics: Self-Aligned Sub-Lithographic Patterning Using Diblock Copolymer Thin Films," Proc. of SPIE, vol. 6153, 615302 (2006).
Black, C. T., et al., Polymer Self Assembly in Semiconductor Microelectronics, IBM J. Res. & Dev. vol. 51, No. 5, Sep. 2007, pp. 605-633.
Botelho Do Rego, A. M, et al., "Diblock Copolymer Ultrathin Films Studied by High Resolution Electron Energy Loss Spectroscopy," Surface Science, 482-485 (2001), pp. 1228-1234.
Brydson, R. M., et al. (chapter authors), "Generic Methodologies for Nanotechnology: Classification and Fabrication", Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).
Bulpitt, P., et al, "New Strategy for Chemical Modification of Hyaluronic Acid: Preparation of Functionalized Derivatives and Their Use in the Formation of Novel Biocompatible Hydrogels," Journal of Biomedical Materials Research, vol. 47, Issue 2, pp. 152-169, Published online Aug. 13, 1999, Abstract only.
Canaria, C. A., et al., "Formation and Removal of Alkylthiolate Self-Assembled Monolayers on Gold in Aqueous Solutions", Lab Chip 6, 289-295 (2006), http://www.rsc.org/publishing/journals/LC/article.asp?doi=b51066c) (Abstract).
Candau, F., et al., "Synthesis and Characterization of Polystyrene-poly(ethylene oxide) Graft Copolymers," Polymer, 1977, vol. 18, pp. 1253-1257.
Cavicchi, K. A., et al., "Solvent Annealed Thin Films of Asymmetric Polyisoprene—Polylactide Diblock Copolymers," Macromolecules 2007, vol. 40, 2007, Univ. of Massachusetts, pp. 1181-1186.
Chandekar, A., et al., "Template-Directed Adsorption of block Copolymers on Alkanethiol-Patterned Gold Surfaces," (circa 2006), http://www.nano.neu.edu/industry/industry_showcase/industry_day/documents/Chandekar.pdf) (Powerpoint template for scientific posters (Swarthmore College)).
Chang, Li-Wen, "Diblock Copolymer Directed Self-Assembly for CMOS Device Fabrication," Proc. of SPIE, vol. 6156, 2006, 615611-1 to 615611-6.
Chang, Li-Wen, "Experimental Demonstration of Aperiodic Patterns of Directed Self-Assembly of Block Copolymer Lithography for Random Logic Circuit Layout," IEEE International Electron Devices Meeting (IEDM), paper 33.2, Dec. 6-8, San Francisco, 2010, pp. 33.2.1-33.2.4.
Cheng, J. Y., et al., "Rapid Directed Self Assembly of Lamellar Microdomains from a Block Copolymer Containing Hybrid," Applied Physics Letters, 91, 143106-143106-3 (2007).
Cheng, J. Y., et al., "Self-Assembled One-Dimensional Nanostructure Arrays," Nano Letters, vol. 6, No. 9, 2006, pp. 2099-2103.
Cheng, J.Y., et al., "Templated Self-Assembly of Block Copolymers: Effect of Substrate Topography," Adv. Mater. 2003, vol. 15, No. 19, pp. 1599-1602.
Choi, H. J., et al., "Magnetorheology of Synthesized Core—Shell Structured Nanoparticle," IEEE Transactions on Magnetics, vol. 41, No. 10, Oct. 2005, pp. 3448-3450.
Daoulas Kostas CH., et al., "Fabrication of Complex Three-Dimensional Nanostructures from Self-Assembling Block Copolymer Materials on Two-Dimensional Chemically Patterned Templates with Mismatched Symmetry," Physical Review Letters 96, week ending Jan. 27, 2006, pp. 036104-1-036104-3.
Darling, S. B., "Directing the Self-assembly of Block Copolymers," Progress in Polymer Science, vol. 32, No. 10, Sep. 28, 2007, pp. 1152-1204.
Desai, DR. Trejal A., et al., "Engineered Silicon Surfaces for Biomimetic Interfaces," Business Briefing: Medical Device Manufacturing & Technology, 2002.
Edwards, E. W., et al., "Mechanism and Kinetics of Ordering in Diblock Copolymer Thin Films on Chemically Nanopatterned Substrates," Journal of Polymer Science: Part B Polymer Physics, vol. 43, 3444-3459, 2005.
Edwards, E. W., et al., "Precise Control over Molecular Dimensions of Block-Copolymer Domains Using the Interfacial Energy of Chemically Nanopatterned Substrates," Advanced Mater., 16, No. 15, Aug. 4, 2004, pp. 1315-1319.
Elisseeff, J., et al., "Photoencapsulation of Chondrocytes in Poly(ethylene oxide)-based Semi-interpenetrating Networks," Journal of Biomedical Materials Research, 51(2): 164-171, Aug. 2000, Abstract only.
Fasolka, M. J. et al., "Morphology of Ultrathin Supported Diblock Copolymer Films: Theory and Experiment," Macromolecules 2000, vol. 33, No. 15, pp. 5702-5712.
Fukunaga, K., et al., "Self-Assembly of Block Copolymer Thin Films Having a Half-Domain-Spacing Thickness: Nonequilibrium Pathways to Achieve Equilibrium Brush Layers Parallel to Substrate," Macromolecules vol. 39, Aug. 2006, pp. 6171-6179.
Gates, B. D., et al., "Unconventional Nanofabrication," Annu. Rev. Mater. Res. 2004, 34:339-72.
Ge, Zhenbin, et al., "Thermal Conductance of Hydrophilic and Hydrophobic Interfaces," PRL 96, 186101-1-186101-4, The American Physical Society, week ending May 12, 2006.
Gelest Inc., "Silane Coupling Agents: Connecting Across Boundaries," v2.0, 2006, pp. 1-56.
Genua, A., et al., "Functional Patterns Obtained by Nanoimprinting Lithography and Subsequent Growth of Polymer Brushes," Nanotechnology, 18, (2007), IOP Publishing Ltd., pp. 1-7.
Gillmor, S. D., et al., "Hydrophilic/Hydrophobic Patterned Surfaces as Templates for DNA Arrays," Langmuir 2000, vol. 16, No. 18, 2000, pp. 7223-7228.
Gudipati, C. S., et al., "Hyperbranched Fluoropolymer and Linear Poly(ethylene glycol) Based Amphiphilic Crosslinked Networks as Efficient Antifouling Coatings: An Insight into the Surface Compositions, Topographies, and Morphologies," Journal of Polymer Science Part A: Polymer Chemistry, vol. 42, (2004), pp. 6193-6208.
Guo, Kai, et al., Abstract of "Synthesis and Characterization of Novel Biodegradable Unsaturated Poly(ester amide)/ Poly(ethylene glycol) Diacrylate Hydrogels", Journal of Polymer Science Part A: Polymer Chemistry, vol. 43, Issue 17, 2005 Wiley Periodicals, Inc., pp. 3932-3944.
Hamley, I. W., "Introduction to Block Copolymers", Developments in Block Copolymers Science and Technology, John Wiley & Sons, Ltd., 2004, pp. 1-29.

(56) References Cited

OTHER PUBLICATIONS

Hammond, M. R., et al., "Temperature Dependence of Order, Disorder, and Defects in Laterally Confined Diblock Copolymer Cylinder Monolayers," Macromolecules, vol. 38, Jul. 2005; American Chemical Society, p. 6575-6585.
Harrison, C., et al., "Layer by Layer Imaging of Diblock Copolymer Films with a Scanning Electron Microscope," Polymer, vol. 39, No. 13, 1998, pp. 2733-2744.
Hawker, C. J., et al., "Facile Synthesis of Block Copolymers for Nanolithographic Applications," Polymer Reprints, American Chemical Society (2005).
Hawker, C. J., et al., Abstract for "Improving the Manufacturability and Structural Control of Block Copolymer Lithography," Abstracts of Papers, 232nd ACS National Meeting, San Francisco, CA, Sep. 10-14, 2006.
He et al., "Self-Assembly of Block Copolymer Micelles in an Ionic Liquid," J. Am. Chem. Soc. 2006, 128, pp. 2745-2750.
Helmbold, A., et al., "Optical Absorption of Amorphous Hydrogenated Carbon Thin Films," Thin Solid Films 283 (1996) pp. 196-203.
Hermans, T. M., et al., "Application of Solvent-Directed Assembly of Block Copolymers to the Synthesis of Nanostructured Materials with Low Dielectric Constants", Angewandte Chem. Int. Ed., vol. 45, Issue 40, Oct. 13, 2006, pp. 6648-6652.
Huang et al., "Stretchable gold conductors on elastomeric substrates," Applied Physics Letters, vol. 82, No. 15, Apr. 14, 2003, pp. 2404-2406.
Hutchison, J. B, et al., "Polymerizable Living Free Radical Initiators as a Platform to Synthesize Functional Networks," Chem. Mater., vol. 17, No. 19, 2005, pp. 4789-4797.
Ikeda, Susumu, et al., "Control of Orientation of Thin Films of Organic Semiconductors by Graphoepitaxy," NanotechJapan Bulletin—vol. 3, No. 3, Dec. 17, 2010/Focus 26-06, NIMS International Center for Nanotechnology Network.
In, Insik, et al., "Side-Chain-Grafted Random Copolymer Brushes as Neutral Surfaces for Controlling the Orientation of Block Copolymer Microdomains in Thin Films," Langmuir, vol. 22, No. 18, 2006, Department of Materials Science and Engineering and Chemical and Biological Engineering, Univ. of Wisconsin-Madison, pp. 7855-7860.
Ji, Shengxiang, et al., "Generalization of the Use of Random Copolymers to Control the Wetting Behaviors of Block Copolymer Films," Macromolecules, 2008, 41(23): 9098-9103.
Ji, Shengxiang, et al., "Preparation of Neutral Wetting Brushes for Block Copolymer Films from Homopolymer Blends," submitted to Advanced Materials, 20(16): 3054-3060; published online Jul. 7, 2008.
Jun, Yongseok, et al., "Microcontact Printing Directly on the Silicon Surface," Langmuir, vol. 18, No. 9, pp. 3415-3417, 2002.
Karim, Alamgir, et al., "Control of Ordering Kinetics and Morphology Using Zone Annealing of Thin Block Copolymer Films", Abstract submitted for the Mar. 2007 Meeting of The American Physical Society, Nov. 20, 2006.
Kim, IS, et al., "Self-assembled Hydrogel Nanoparticles Composed of Dextran and Poly (ethylene glycol) Macromer," Int J Pharm., Sep. 15, 2000; 205(1-2): 109-116, Abstract only.
Kim, Sang Ouk, et al., "Novel Complex Nanostructure from Directed Assembly of Block Copolymers on Incommensurate Surface Patterns," Adv. Mater., 2007, 19, pp. 3271-3275.
Kim, Seung Hyun, et al., "Highly Oriented and Ordered Arrays from Block Copolymers via Solvent Evaporation," Adv. Mater. 2004, 16, No. 3, Feb. 3, pp. 226-231.
Kim, Seung Hyun, et al., "Salt Complexation in Block Copolymer Thin Films," Macromolecules 2006, vol. 39, No. 24, 2006, pp. 8473-8479.
Kim, Seung Hyun, et al., "Solvent-Induced Ordering in Thin Film Diblock Copolymer/Homopolymer Mixtures," Advanced Mater., vol. 16, No. 23-24, Dec. 17, 2004, pp. 2119-2123.
Kim, SH, et al., "In Vitro Release Behavior of Dextran-methacrylate Hydrogels Using Doxorubicin and Other Model Compounds," J Biomater Appl., Jul. 2000; 15(1): 23-46 Abstract only.
Kim, SH, et al., "Synthesis and characterization of Dextran-methacrylate Hydrogels and Structural Study by SEM," J Biomater Res., Mar. 15, 2000; 49(4): 517-27 Abstract only.
Kim, Su-Jin, et al., "Hybrid Nanofabrication Processes Utilizing Diblock Copolymer Nanotemplate Prepared by Self-assembled Monolayer Based Surface Neutralization," J. Vac. Sci. Technol. B26(1), Jan./Feb. 2008, © 2008 American Vacuum Society, pp. 189-194.
Knoll, A., et al., "Phase Behavior in Thin Films of Cylinder-Forming Block Copolymers," Physical Review Letters vol. 89, No. 3 Jul. 2002, The American Physical Society, pp. 035501-1 to 035501-4.
Krishnamoorthy et al., Nonopatterned Self-Assembled Monolayers by Using Diblock Copolymer Micelles as nanometer-Scale Adsorption and Etch Masks, Advanced Materials, 2008, pp. 1-4.
Krishnamoorthy, S., et al., "Nanoscale Patterning with Block Copolymers," Materials Today, vol. 9, No. 9, Sep. 2006, pp. 40-47.
Kuhnline et al., "Detecting thiols in a microchip device using micromolded carbon ink electrodes modified with cobalt phthalocyanine", Analyst, vol. 131, pp. 202-207, (2006).
La, Young-Hye, et al., "Directed Assembly of Cylinder-Forming Block Copolymers into Patterned Structures to Fabricate Arrays of Spherical Domains and Nanoparticles," Chem. Mater, 2007, vol. 19, No. 18, Department of Chemical and Biological Engineering and Center for Nanotechnology, Univ. of Wisconsin, pp. 4538-4544.
La, Young-Hye, et al., "Pixelated Chemically Amplified Resists: Investigation of Material Structure on the Spatial Distribution of Photoacids and Line Edge Roughness," J. Vac. Sci. Technol. B 25(6), Nov./Dec. 2007, American Vacuum Society, pp. 2508-2513.
Laracuente, A.R., et al., "Step Structure and Surface Morphology of Hydrogen-terminated Silicon: (001) to (114)," Surface Science 545, 2003, pp. 70-84.
Lentz, D, et al., "Whole Wafer Imprint Patterning Using Step and Flash Imprint Lithography: A Manufacturing Solution for Sub 100 nm Patterning", SPIE Advanced Lithography Paper, http://molecularimprints.com/NewsEvents/tech_articles/new_articles/SPIE_07_MII_WW_Paper.pdf), Molecular Imprints, Inc., Texas, USA, Feb. 2007, pp. 1-10.
Li, Mingqi, et al., "Block Copolymer Patterns and Templates," Materials Today, vol. 9, No. 9, Sep. 2006, pp. 30-39.
Li, Wai-Kin, et al, "Creation of Sub-20-nm Contact Using Diblock Copolymer on a 300 mm Wafer for Complementary Metal Oxide Semiconductor Applications," J. Vac. Sci. Technol. B 25(6), Nov./Dec. 2007, American Vacuum Society, pp. 1982-1984.
Li, Xue, et al., "Morphology Change of Asymmetric Diblock Copolymer Micellar Films During Solvent Annealing," ScienceDirect, Polymer 48 (2007), pp. 2434-2443.
Lin, Zhiqun, et al., "A Rapid Route to Arrays of Nanostructures in Thin Films," Adv. Mater. 2002, 14 No. 19, Oct. 2, pp. 1373-1376.
Lin-Gibson, Sheng, et al., "Structure—Property Relationships of Photopolymerizable Poly(ethylene glycol) Dimethacrylate Hydrogels," Macromolecules 2005, 38, American Chemical Society, pp. 2897-2902.
Lutolf, M., et al., "Cell-Responsive Synthetic Hydrogels," Adv. Mater., vol. 15, No. 11, Jun. 2003, pp. 888-892.
Malkoch, M., et al., "Synthesis of Well-defined Hydrogel Networks Using Click Chemistry," Chem. Commun., 2006, The Royal Society of Chemistry, pp. 2774-2776.
Mansky, P., et al., "Controlling Polymer-Surface Interactions with Random Copolymer Brushes," Science, vol. 275, Mar. 7, 1997, pp. 1458-1460.
Martens, P., et al., "Characterization of Hydrogels Formed from Acrylate Modified Poly(vinyl alcohol) Macromers," Polymer, vol. 41, Issue 21, Oct. 2000, pp. 7715-7722, Abstract only.
Matsuda, T., et al., "Photoinduced Prevention of Tissue Adhesion," ASAIO J, Jul.-Sep. 1992; 38(3): M154-7, Abstract only.
Maye, M. A., et al., "Chemical Analysis Using Force Microscopy," Journal of Chemical Education, vol. 79, No. 2, Feb. 2002, Dept. of Chemistry, State Univ. of New York at Binghamton, USA, pp. 207-210.
Metters, A., et al., "Network Formation and Degradation Behavior of Hydrogels Formed by Michael-Type Addition Reactions," Biomacromolecules 2005, 6, 2005, pp. 290-301.

(56) References Cited

OTHER PUBLICATIONS

Meyer, E., et al., "Controlled Dewetting Processes on Microstructured Surfaces—a New Procedure for Thin Film Microstructuring," Macromollecular Mater. Eng., 276/277, 2000, Institute of Polymer Research Dresden, pp. 44-50.
Mezzenga, R., et al., "On the Role of Block Copolymers in Self-Assembly of Dense Colloidal Polymeric Systems," Langmuir 2003, vol. 19, No. 20, 2003, American Chemical Society, pp. 8144-8147.
Mindel, J., et.al., "A Study of Bredig Platinum Sols", The Chemical Laboratories of New York University, received Jun. 10, 1943, vol. 65 pp. 2112.
Naito, K., et al., "2.5-Inch Disk Patterned Media Prepared by an Artificially Assisted Self-Assembling Method," IEEE Transactions on Magnetics, vol. 38, No. 5, Sep. 2002, pp. 1949-1951.
Nealey, P. F., et al., "Self-Assembling Resists for Nanolithography", IProceedings of the IEEE International Electron Devices Meeting, IEDM Technical Digest, 356-359 (2005).
Nguyen, K. T., et al., "Photopolymerizable Hydrogels for Tissue Engineering Applications," Biomaterials 23, 2002, pp. 4307-4314.
Nishikubo, T., "Chemical Modification of Polymers via a Phase-Transfer Catalyst or Organic Strong Base," American Chemical Society Symposium Series, 1997, American Chemical Society, pp. 214-230.
Niu, Sanjun, et al., "Stability of Order in Solvent-Annealed Block Copolymer Thin Films," Macromolecules, vol. 36, No. 7, 2003, Univ. of Nebraska, USA, pp. 2428-2440, (web release date: Mar. 13, 2003) (http://digitalcommons.uni.edu/cgi/viewcontent.cgi?article+1005 &contect=chemeng_nanotechnology).
Olayo-Valles, R., et al., "Large Area Nanolithographic Templates by Selective Etching of Chemically Stained Block Copolymer Thin Films," J. Mater. Chem, 2004, 14, The Royal Society of Chemistry, pp. 2729-2731.
Parejo, P. G., et al., "Highly Efficient UV-absorbing Thin-film Coatings for Protection of Organic Materials Against Photodegradation," J. Mater. Chem., 2006, 16, The Royal Society of Chemistry, pp. 2165-2169.
Park, Cheolmin, et al., "Enabling Nanotechnology with Self Assembled Block Copolymer Patterns," Polymer 44, 2003, pp. 6725-6760.
Park, Dae-Ho, "The Fabrication of Thin Films with Nanopores and Nanogrooves from Block Copolymer Thin Films on the Neutral Surface of Self-assembled Monolayers," Nanotechnology 18, 2007, 355304, IIOP Publishing LTD, UK, pp. 1-7.
Park, M., et al., "Block Copolymer Lithography: Periodic Arrays of 1011 Holes in 1 Square Centimeter," Science, vol. 276, No. 5317, May 30, 1997, pp. 1401-1404.
Park, Seung Hak, et al., "Block Copolymer Multiple Patterning Integrated with Conventional ArF Lithography," Soft Matter, 2010, 6, Royal Society of chemistry, pp. 120-125.
Black et al., Integration of Self Assembly for Semiconductor Microelectronics, IEEE 2005 Custom Integrated Circuits Conference, IBM T.J. Watson Research Center, (2005), pp. 87-91.
Kim et al., Epitaxial Self-assembly of Block Copolymers on Lithographically Defined Nanopatterned Substrates, Nature, vol. 424, (Jul. 24, 2003), pp. 411-414.
Lutolf et al., Synthetic Biomaterials as Instructive Extracellular Microenvironments for Morphogenesis in Tissue Engineering, Nature Biotechnology, vol. 23, (2005), pp. 47-55, abstract only.
Fujita et al., Thin Silica Film with a Network Structure as Prepared by Surface Sol-Gel Transcription on the Poly (styrene-b-4-vinylpyridine) Polymer Film, Chemistry Letters, vol. 32, No. 4, Dec. 31, 2003, pp. 352-353.
Melde et al., Silica Nanostructures Templated by Oriented Block Copolymer Thin Films Using Pore-Filling and Selective-Mineralization Routes, Chem. Mater., vol. 17, No. 18, Aug. 13, 2005, pp. 4743-4749.
Cheng et al., Templated Self-Assembly of Block Copolymers: Top-Down Helps Bottom-Up, Adv. Mater., (2006), 18, pp. 2505-2521.
Li et al., Ordered Block-Copolymer Assembly Using Nanoimprint Lithography, Nano. Lett. (2004), vol. 4, No. 9, pp. 1633-1636.

* cited by examiner

METHODS OF FORMING A STAMP AND A STAMP

CROSS-REFERENCE TO RELATED APPLICATIONS

This application is a divisional of U.S. patent application Ser. No. 11/787,928, filed Apr. 18, 2007, now U.S. Pat. No. 7,959,975, issued Jun. 14, 2011, the disclosure of which is hereby incorporated herein by this reference in its entirety. This application is also related to U.S. patent application Ser. No. 11/766,663, filed Jun. 21, 2007, now U.S. Pat. No. 8,294, 139, issued Oct. 23, 2012, for MULTILAYER ANTIREFLECTION COATINGS, STRUCTURES AND DEVICES INCLUDING THE SAME AND METHODS OF MAKING THE SAME, and U.S. patent application Ser. No. 12/259, 921, filed Oct. 28, 2008, now U.S. Pat. No. 8,097,175, issued Jan. 17, 2012 for METHODS FOR SELECTIVELY PERMEATING A SELF-ASSEMBLED BLOCK COPOLYMER, METHOD FOR FORMING METAL OXIDE STRUCTURES, METHOD FOR FORMING A METAL OXIDE PATTERN, AND METHOD FOR PATTERNING A SEMICONDUCTOR STRUCTURE.

TECHNICAL FIELD

Embodiments of the invention relate to semiconductor fabrication and, more specifically, to methods, a stamp and a system for patterning a substrate.

BACKGROUND

As the development of nanoscale semiconductor devices and systems increase, new processes and materials are needed to fabricate such semiconductor devices and components. While feature sizes on the semiconductor devices are decreasing, the cost of lithographic tools is increasing exponentially. Further reductions in feature size are often restricted by the lower limit of dimensions that can be achieved using lithographic methods. Semiconductor devices having features of about 60 nanometers (nm) or less, which are referred to herein as "sub-lithographic" features, are difficult to produce using conventional lithography.

Microcontact printing is one method for creating sub-lithographic features on semiconductor devices. The technique creates self-assembled monolayers (SAMs) on specific sites on a surface of a substrate of the semiconductor device. In a conventional process, a master mold with topographical features is prepared by photolithography or electron (e-beam) lithography. Referring to FIG. 1A, a stamp substrate 10 having a resist 12 thereon creates a pattern on a surface of the stamp substrate 10. An elastomer casing 14, conventionally formed from polydimethylsiloxane, is deposited over the stamp substrate 10 and resist 12 and cured. The stamp substrate 10 and resist 12 are separated from the cured elastomer casing 14 to form a soft stamp 14' with topographical features. (FIGS. 1B and 1C) The soft stamp 14' includes a pattern that corresponds to the pattern in the resist 12, which pattern is to be formed on the semiconductor device. The soft stamp 14' is then wetted with an ink 16 and brought into contact with a receptor substrate 18. (FIG. 1D) The ink is physisorbed on the soft stamp 14' and is transferred to the receptor substrate 18 to form SAMs 20. (FIG. 1F) Theoretically, the SAMs 20 are formed only in regions where the ink 16 contacts the receptor substrate 18. However, the physisorbed nature of the ink 16 leads to poor resolution of the stamped features on the receptor substrate 18 as ink 16 not in contact with the receptor substrate 18 wicks down the soft stamp 14' due to capillary action. Another disadvantage is that the stamped features are no smaller than the lithographically defined features of the soft stamp 14'.

Attempts have been made to prepare sub-lithographic features on semiconductor devices by other methods known in the art. For example, e-beam lithography and extreme ultraviolet (EUV) lithography have been used in attempts to prepare such sub-lithographic features. However, widespread use of such methods has been hampered by difficulties including, for example, high costs and/or incompatibility with high throughput production methods. Accordingly, improved methods and systems for preparing sub-lithographic features on semiconductor devices are desired, as are stamps for achieving same.

DETAILED DESCRIPTION

The following description with reference to the drawings describes embodiments of devices and methods according to the invention. Such description is for illustrative purposes only and not for purposes of limiting the same. Other embodiments of the present invention are contemplated and encompassed thereby.

An embodiment of a method of the present invention for patterning a substrate is disclosed, as are embodiments of a stamp and a patterning system of the present invention. According to one embodiment, a stamp may be prepared or selected such that at least one region of a stamping surface of the stamp has chemical affinity for an ink material, as indicated at 1000 in FIG. 2. As used herein, the term "chemical affinity" means and includes the tendency of a molecule to associate with another molecule based on chemical forces between the molecules. The region of chemical affinity on the stamping surface forms a pattern that mirrors a desired pattern to be formed on a receptor substrate. As used herein, the term "receptor substrate" means and includes semiconductor substrates, silicon wafers, silicon on insulator ("SOI") substrates, silicon on sapphire ("SOS") substrates, epitaxial layers of silicon on a base semiconductor foundation and other semiconductor materials such as silicon-germanium, germanium, gallium arsenide and indium phosphide. In one embodiment, the receptor substrate includes silicon dioxide. However, a wide variety of materials may be used as the receptor substrate, such as any electrically conductive, electrically non-conductive, or electrically semiconductive material forming a solid phase at room temperature, as long as the receptor substrate and the ink material are capable of chemically bonding.

The stamping surface includes at least a first region having chemical affinity for the ink material. Other regions of the stamping surface may lack chemical affinity for the ink material or may have a different chemical affinity for the ink material, such as substantially less chemical affinity. The region of chemical affinity provides the stamping surface with at least one region of chemical differentiation, which has different chemical properties than the other regions of the stamping surface. The region of chemical differentiation enables the stamping surface to chemically react with at least a portion of the ink material. The region of chemical differentiation may be formed by depositing a material having chemical affinity for the ink material on the stamp, or by modifying the deposited material or the stamping surface to include moieties or functional groups having chemical affinity for the ink material. The region of chemical differentiation on the stamping surface may include, for example, gold, thiol functional groups or amine functional groups.

Figure 3:
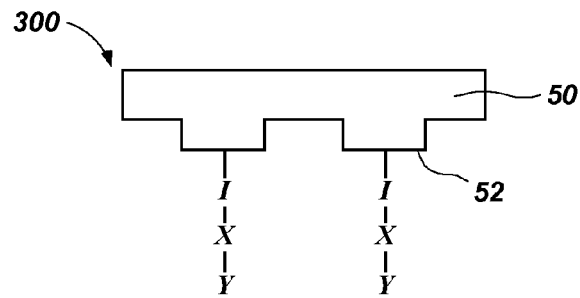
FIG. 3 is a cross-sectional view of an embodiment of a stamp of the present invention with an ink material chemisorbed to the stamp.

As illustrated in FIG. 3, an embodiment of stamp 300 may include the regions of chemical differentiation 52 and the stamp substrate 50. The stamping surface of the stamp 300 may be substantially planar with at least one region of chemical differentiation 52 thereon, with the remainder of the stamping surface lacking chemical affinity for the ink material. Alternatively, the stamping surface may include topographical features wherein peak tips of the topographical features have chemical affinity for the ink material. As such, the peak tips correspond to the regions of chemical differentiation 52. The peak tips may be formed from a different material than the other portions of the stamp 300. Regardless of whether the stamping surface is substantially planar or includes topographical features, in one embodiment, the regions of chemical differentiation 52 include a region of gold. In another embodiment, the regions of chemical differentiation 52 include a region formed from another inorganic material, such as silicon dioxide, modified with thiol or amine functional groups. In another embodiment, the regions of chemical differentiation 52 include domains of a self-assembled block copolymer. The block copolymer surface may be modified to include, for example, gold, thiol or amine functional groups. The ink material (I-X-Y) is also shown in FIG. 3, attached to the stamp 300 through the regions of chemical differentiation 52. Additional details of the ink material and of fabricating the stamp 300 are described herein.

Figures 1A, 1B, 1C, 1D, 1E, 1F:
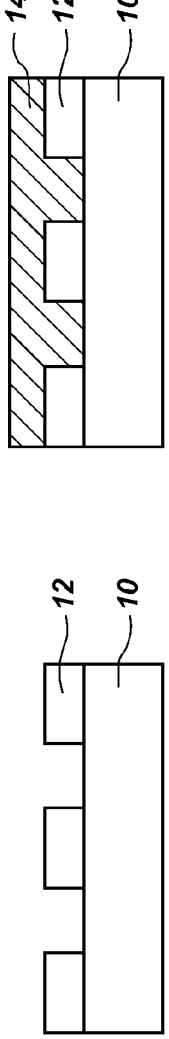
FIGS. 1A-1C are cross-sectional views of a soft stamp during various stages of fabrication according to conventional process techniques.
FIGS. 1D-1F are cross-sectional views of a soft stamp during microcontact printing according to conventional process techniques.
Figure 2:
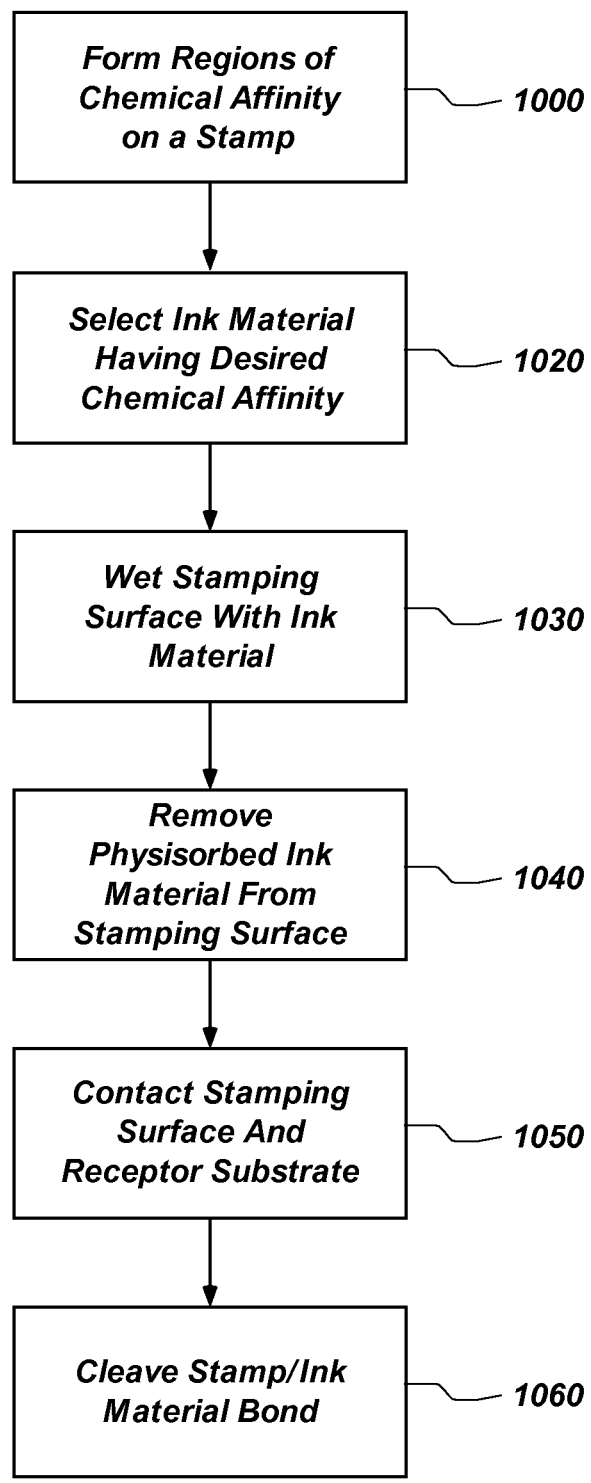
FIG. 2 is a flow chart of an embodiment of fabricating and using a stamp of the present invention.

As indicated at 1020 of FIG. 2, the ink material is selected such that the chemical affinity between the stamping surface and the ink material is less than the chemical affinity between the ink material and the receptor substrate. The ink material may be any material to be deposited on the receptor substrate and capable of forming a pattern, such as a SAM, on the receptor substrate. By way of non-limiting example, the ink material may be a small molecule with the ability to function as a SAM. The ink material may include at least one functional group that chemically reacts with the region of chemical differentiation 52 on the stamping surface. The ink material may also include at least one functional group that chemically reacts with the receptor substrate. The ink material may be mono-functional, bi-functional or more. In one embodiment, the ink material has two or more functional groups on opposite ends of the ink material, providing orthogonal reactivity. As used herein, the term "orthogonal reactivity" means and includes at least one functional group on the ink material that reacts in a first manner and at least one functional group on the ink material that is inert or reacts in a second, different manner under the same conditions.

The ink material may have a composition of I-X-Y, where "I" includes a first functional group capable of binding to the region of chemical differentiation 52, "X" is a spacer or linker molecule and "Y" includes a second functional group capable of binding to the receptor substrate. Any portion of I and Y may include the functional group capable of bonding to the stamping surface or the receptor substrate. For instance, a terminal portion of I or a terminal portion of Y may include the desired functional group, or an interior portion of I or an interior portion of Y may include the desired functional group. Additional ink materials other than those described herein may be used as long as portions "I" and "Y" are present in such a manner that they do not interfere with each other's respective binding or with the creation of the pattern on the receptor substrate.

The spacer (X) of the ink material may be selected to provide a particular thickness of the resultant pattern on the receptor substrate. Any spacer that does not disrupt binding of the ink material to the region of chemical differentiation 52 and receptor substrate is suitable. The spacer may be a polar, nonpolar, positively charged, negatively charged, or uncharged molecule. By way of non-limiting example, a saturated or unsaturated, linear or branched alkyl, aryl, or other hydrocarbon spacer may be used, as well as corresponding halogenated hydrocarbons, especially fluorinated hydrocarbons. By way of non-limiting example, the ink material may be 2-aminoethanethiol, aminothiophenol, cysteine, homocysteine, leucinethiol, 2-butylaminoethanethiol, 2-cyclohexylaminoethanethiol, a mercapto alcohol, e.g., 2-mercaptoethanol ($HS-CH_2CH_2OH$) or 4-mercapto-1-butanol, acetylenic thiol, an aliphatic or aromatic thiol, lactic acid, hydroxybutyric acid, hydroxyisocaproic acid, hydroxyisophthallic acid, 8-hydroxy-7-iodo-5-quinolinesulfonic acid, hydroxymandelic acid, hydroxymethanesulfinic acid, a hydroxybenzoic acid, hydroxynapthalenesulfonic acid, hydroxypentadecanoic acid, hydroxyundecanoic acid, an acetylenic carboxylate or sulfonate, e.g., propiolic acid, 4-butynoic acid, or 5-pentynoic acid, or combinations thereof.

As indicated at 1030 and 1040 of FIG. 2, the stamping surface is wetted with the ink material. Physisorbed ink material is removed from the stamping surface while chemisorbed ink material remains on the regions of chemical differentiation 52. As used herein, the tam "physisorbed" and grammatical equivalents thereof means and includes the physical adsorption of a molecule, such as the ink material, to a surface, such as the stamping surface. The physisorbed ink material may be adhered to the stamping surface through weak intermolecular interactions, such as Van der Waals forces. As used herein, the term "chemisorbed" and grammatical equivalents thereof means and includes the chemical adsorption of a molecule, such as the ink material, to a surface, such as the stamping surface. The chemisorbed ink material may be chemically bonded to the stamping surface, such as through hydrogen bonds, ionic bonds, dithiol linkages, electrostatic bonds or any other so-called "weak" chemical bond. For example, the stamp may be washed under conditions that remove the physisorbed ink material, but do not remove the chemisorbed ink material due to the chemical affinity of the ink material for the regions of chemical differentiation 52.

For hydrogen bonds, electrostatic or acid/base interaction, the wash is preferably a non-polar organic solvent that has at least some ability to solvate the ink material. Polar solvents tend to disrupt the chemisorbed ink. A wash may be performed for approximately 0.1 to 1 minute at a temperature up to the boiling point of the solvent or ink material. In some embodiments, the ink material may be removed by heating the ink material-stamp complex so as to boil off the physisorbed ink. Alternatively, the ink material-stamp complex may be exposed to a high vacuum so as to pull off physisorbed ink without removing the chemisorbed ink material. FIG. 3 depicts an embodiment of a stamp 300 having chemisorbed ink material (I-X-Y) on the regions of chemical differentiation 52. Thus, the ink material is only in contact with the regions of chemical differentiation 52.

The stamping surface may be wetted with the ink material under conditions, which enable the ink material to react chemically with the regions of chemical differentiation 52. The ink material may be coated onto the stamping surface by any convenient method. By way of non-limiting example, the ink material may be directly contacted with the stamping surface or the ink material may be absorbed onto a piece of paper and the stamping surface may be pressed against the piece of paper. Alternately, a cotton swab or the like may be used to transfer ink material to the stamping surface. Ink material may be rapidly transferred to the stamping surface. For example, contacting the stamping surface with ink material for a period of time of approximately 6 to 600 seconds is sufficient to enable the ink material to chemisorb to the region of chemical differentiation 52. However, contact may be maintained for substantially longer periods of time to ensure that the ink material reacts with the region of chemical differentiation 52. The "I" portion of the ink material may react with the stamping surface, forming hydrogen bonds, ionic bonds, dithiol linkages, electrostatic bonds, or any other so-called "weak" chemical bond. In one embodiment, the stamp includes gold regions of chemical differentiation 52 thereon and reacts with the ink material having at least one sulfur-containing functional group, such as a thiol functional group.

Depending on the nature of the bonds that form between the stamping surface and ink material, the ink material may be applied to the stamping surface using a non-aqueous medium. For example, if the ink material and stamping surface interact via acid/base interaction, exposure to a polar solvent may interfere with the ink material binding to the stamping surface. In other embodiments, the ink material may be dissolved in a solvent for transfer to the stamping surface. The ink material may be transferred to the stamping surface in a solvent at a concentration of less than 0.001 mM, preferably from about 1 to about 10 k mM. Any solvent within which the ink material is substantially soluble, and which allows the ink material to chemically bind to the stamping surface, may be used.

The stamping surface may, optionally, be exposed to more than one ink material where the second ink material may be chemically distinct from the first ink material. The exposure to the second ink material may be substantially simultaneous with the introduction of the first ink material or may be separate. As described in more detail herein, the second ink material may chemically react with second regions of chemical differentiation that are distinct from the regions of chemical differentiation 52 that bind to the first ink material.

Figure 4:
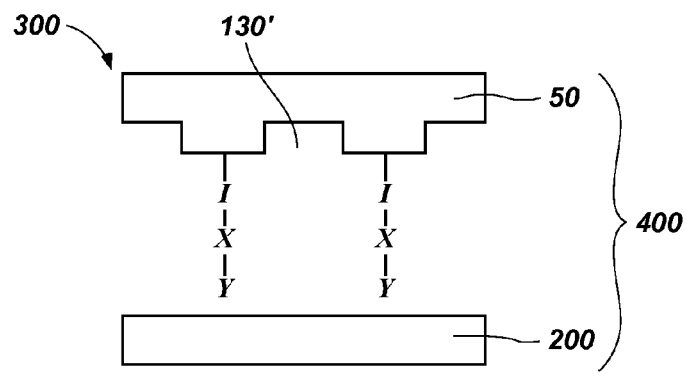
FIG. 4 is a cross-sectional view of a stamp-ink material-receptor substrate complex according to an embodiment of the present invention.

As indicated at 1050 of FIG. 2 and illustrated in FIG. 4, the stamp 300 having the ink material chemisorbed to the region of chemical differentiation 52 is brought into contact with a receptor substrate 200, forming a stamping surface-ink material-receptor substrate complex 400. As described in detail below, the receptor substrate 200 may, optionally, include an additional material layer thereon to improve wettability of the receptor substrate 200. Upon contact, the Y portion of the ink material may form a chemical bond with the receptor substrate 200. The bonds between the ink material and the receptor substrate 200 may be covalent, ionic or polar bonds. The chemical bonds between the stamping surface and the ink material may have a weaker bond strength than those between the ink material and the receptor substrate 200. The stamp 300 may be contacted with the receptor substrate 200 under appropriate conditions to transfer the ink material from the stamping surface to desired regions on the receptor substrate 200. The temperature during ink material transfer to the receptor substrate may be selected to maximize the rate of binding without cleaving the ink material-receptor substrate or ink material-stamping surface bonds. Thus, the ink material-receptor substrate bonds may form prior to cleaving the ink material-stamping surface bonds. Selection of the appropriate range of temperatures is within the skill of one in the art and depends upon the particular ink material and receptor substrate. Generally, suitable temperatures will range from room temperature to near boiling point of the ink material. The stamping surface and the receptor surface 200 may be contacted under conditions that enable chemical bonds to form between the receptor substrate 200 and the ink material. In one embodiment, the stamping surface-ink material-receptor substrate complex remains intact for approximately 1 minute to 240 minutes. For example, 15 minutes may be adequate for microcontact printing using Huisgens-1,3-dipolar cycloaddition reaction.

As indicated at 1060 of FIG. 2, the stamping surface-ink material-receptor substrate complex 400 may be exposed to conditions which eliminate or disrupt the chemical affinity between the regions of chemical differentiation 52 on the stamping surface and the ink material, while the chemical affinity between the ink material and the receptor substrate 200 may be substantially unaffected by the conditions. The bonds between the stamp 300 and the ink material may be cleaved thermally, oxidatively, electrochemically, or by exposure to a polar, protic solvent. By way of non-limiting example, if the regions of chemical differentiation 52 include gold or thiol groups, the bonds between the stamp 300 and the ink material may be cleaved thermally, oxidatively, or electrochemically. If, however, the regions of chemical differentiation 52 include acid/base groups, the bonds between the stamp 300 and the ink material may be cleaved by exposure to a polar, protic solvent.

In one embodiment, if the stamping surface includes topographical features, which correspond to the regions of chemical differentiation 52, an aqueous solution is introduced into channels between the topographical features to cleave the bonds between the stamp 300 and the ink material. By way of non-limiting example, referring to FIG. 4, the aqueous solution may be introduced into voids 130' to break the bonds between the ink material and the stamp 300. In another embodiment, the bonds between the ink material and the regions of chemical differentiation 52 are cleaved by applying heat to the stamping surface-ink material-receptor substrate complex 400. In one embodiment, the bonds between the ink material and the regions of chemical differentiation 52 are cleaved by contacting the stamping surface-ink material-receptor substrate complex 400 with a solution having a high ionic strength. In another embodiment, the bonds between the ink material and the regions of chemical differentiation 52 are cleaved by contacting the stamping surface-ink material-receptor substrate complex 400 with a solution having a high ionic strength and applying heat. The bonds between the ink material and the regions of chemical differentiation 52 may be cleaved without cleaving most of the bonds between the ink material and the receptor substrate 200. The stamp 300 may be removed from the receptor substrate 200, leaving ink material (which may form, for example, SAMs) on portions of the receptor substrate 200 in contact with the regions of chemical differentiation 52 of the stamping surface. The stamp 300 may then be prepared and re-inked for further receptor substrate stamping.

By way of non-limiting example, if the stamp 300 has gold regions of chemical differentiation 52 and the ink material includes thiol functional groups, the stamp 300 may be exposed to hydrogen peroxide or bleach to oxidize the thiol functional groups to sulfonic acid, cleaving the ink material from the gold regions of chemical differentiation 52. Since the gold-thiol bonds are relatively weak (20 Kcal/mol-35 Kcal/mol) as compared to potential C—N, C—O, Si—O or Si—N bonds between the ink material and the receptor substrate 200, the gold-thiol bonds may be cleaved without disrupting the ink material/receptor substrate bonds. Other methods of cleaving the gold-thiol bond include thermal cleavage and electrochemical cleavage.

By way of non-limiting example, if the stamp 300 has regions of chemical differentiation 52 that include thiol functional groups (e.g., mercaptopropyl(trialkoxy)silanes), the disulfide bonds between the stamp 300 and the ink material may be cleaved by reductive conditions including (1) exposure to metallic zinc; (2) electrochemical reduction or (3) exposure to other thiols (e.g., thiol-disulfide rearrangement discussed herein). Dithiothreitol is a particularly useful reagent for reducing disulfides to thiols in this manner.

By way of non-limiting example, if the stamp 300 includes amine regions of chemical differentiation 52 (e.g., aminoalkyl(trialkoxy)silanes) and the ink contains carboxyl or other acid group, the acid-base interaction may be broken by exposure to a polar, protic solvent (e.g., water, methanol, ethanol, formic acid, hydrogen fluoride, ammonia or combinations thereof). In this situation, applying the ink material to the stamp 300 and contacting the stamp 300 and the receptor substrate 200 may occur in the absence of a polar, protic solvent. A polar aprotic solvent (e.g., dimethyl sulfoxide, dimethylformamide, or hexamethylphosphorotriamide) may be present during the stamping, if miscible with polar, protic solvents that disrupt the stamp-ink material bond, which is dried after the stamping.

Table 1 is a non-limiting, exemplary list of materials that may be used in combination as the regions of chemical differentiation 52, the receptor substrate 200 and the ink material. The ink material may react with the regions of chemical differentiation 52 and the receptor substrate 200 to form the stamping surface-ink material-receptor substrate complex 400.

TABLE 1

Materials for the Regions of Chemical Differentiation, Inks, and Receptor Substrates

| Regions of Chemical Differentiation | Ink Material | Receptor Substrate |
| --- | --- | --- |
| Gold | 2-aminoethanethiol, aminothiophenol, cysteine, homocysteine, leucinethiol, 2-butylaminoethanethiol, or 2-cyclohexylaminoethanethiol | $SiO_2$ grafted with a glycidoxypropyl(trialkoxy)silane |
| Gold | To form urea linkers: 2-aminoethanethiol, aminothiophenol, cysteine, homocysteine, leucinethiol, 2-butylaminoethanethiol, or 2-cyclohexylaminoethanethiol to form urethane linkers: any mercapto alcohol, e.g., 2-mercaptoethanol (HS—$CH_2CH_2$OH) or 4-mercapto-1-butanol | $SiO_2$ grafted with an isocyanatopropyl(trialkoxy)silane |
| Gold | Any acetylenic thiol | $SiO_2$ grafted with 6-azidosulfonyl-hexyl(triethoxy) silane or $SiO2$ grafted with 11-bromoundecyl (triethoxy) silane and further reacted with sodium azide |
| Gold | 2-aminoethanethiol, aminothiophenol, cysteine, homocysteine, leucinethiol, 2-butylaminoethanethiol, 2-cyclohexylaminoethanethiol, any mercapto alcohol, e.g., 2-mercaptoethanol (HS—$CH_2CH_2$OH) or 4-mercapto-1-butanol | Si—Cl from H-terminated silicon |
| Gold | Any aliphatic or aromatic thiol | $SiO_2$ grafted with 6-azidosulfonyl-hexyl(triethoxy) silane or $SiO2$ grafted with 11-bromoundecyl (triethoxy) silane and further reacted with sodium azide |
| Thiol Group | 2-aminoethanethiol, aminothiophenol, cysteine, homocysteine, leucinethiol, 2-butylaminoethanethiol, or 2-cyclohexylaminoethanethiol | $SiO_2$ grafted with a glycidoxy-propyl(trialkoxy) silane |
| Thiol Group | To form urea linkers: 2-aminoethanethiol, aminothiophenol, cysteine, homocysteine, leucinethiol, 2-butylaminoethanethiol, or 2-cyclohexylaminoethanethiol To form urethane linkers: any mercapto alcohol, e.g., 2-mercaptoethanol (HS—$CH_2CH_2$OH) or 4-mercapto-1-butanol | $SiO_2$ grafted with an isocyanatopropyl(trialkoxy) silane |

TABLE 1-continued

Materials for the Regions of Chemical Differentiation, Inks, and Receptor Substrates

| Regions of Chemical Differentiation | Ink Material | Receptor Substrate |
| --- | --- | --- |
| Thiol Group | Any acetylenic thiol e.g., N (2-mercaptoethyl) propiolamide | $SiO_2$ grafted with 6-azidosulfonyl-hexyl(triethoxy) silane silane or SiO2 grafted with 11-bromoundecyl (triethoxy) silane and further reacted with sodium azide |
| Thiol Group | 2-aminoethanethiol, aminothiophenol, cysteine, homocysteine, leucinethiol, 2-butylaminoethanethiol, 2-cyclohexylaminoethanethiol or any mercapto alcohol, e.g., 2-mercaptoethanol ($HS-CH_2CH_2OH$) or 4-mercapto-1-butanol | Si—Cl from H-terminated silicon |
| Thiol Group | Any aliphatic or aromatic thiol | $SiO_2$ grafted with 6-azidosulfonyl-hexyl(triethoxy) silane or SiO2 grafted with 11-bromoundecyl (triethoxy) silane and further reacted with sodium azide |
| Amine Group | lactic acid, hydroxybutyric acid, hydroxyisocaproic acid, hydroxyisophthallic acid, 8-hydroxy-7-iodo-5-quinolinesulfonic acid, hydroxymandelic acid, hydroxymethanesulfinic acid, hydroxybenzoic acids, hydroxynapthalenesulfonic acid, hydroxypentadecanoic acid, or hydroxyundecanoic acid | $SiO_2$ grafted with an isocyanatopropyl(trialkoxy) silane |
| Amine Group | any acetylenic carboxylate or sulfonate, e.g., propiolic acid, 4-butynoic acid, 5-pentynoic acid, etc. | $SiO_2$ grafted with 6-azidosulfonyl-hexyl(triethoxy) silane silane or SiO2 grafted with 11-bromoundecyl (triethoxy) silane and further reacted with sodium azide |
| Amine Group | lactic acid, hydroxybutyric acid, hydroxyisocaproic acid, hydroxyisophthallic acid, 8-hydroxy-7-iodo-5-quinolinesulfonic acid, hydroxymandelic acid, hydroxymethanesulfinic acid, hydroxybenzoic acids, hydroxynapthalenesulfonic acid, hydroxypentadecanoic acid, or hydroxyundecanoic acid | Si—Cl from H-terminated silicon |
| Amine Group | Any aliphatic or aromatic thiol | $SiO_2$ grafted with 6-azidosulfonyl-hexyl(triethoxy) silane or SiO2 grafted with 11-bromoundecyl (triethoxy) silane and further reacted with sodium azide |

Figure 5:
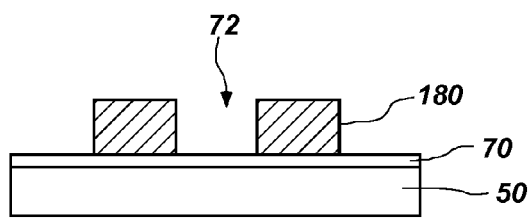
FIGS. 5-18 are cross-sectional views of embodiments of stamp structures or intermediate stamp structures of the present invention during various stages of fabrication.

Although Table 1 identifies certain ink materials having orthogonal reactivity, many functional groups in the ink materials are suitable for use with materials with which they are not categorized in Table 1. Any and all such combinations are within the scope of the present invention. The ink material/stamping surface and ink material/receptor substrate combination may be selected based on conventional understanding of chemical interactions and bond strengths. The stamp 300 may be formed by any conventional method that produces the desired pattern on the stamping surface, which pattern mirrors the pattern to be formed on the receptor substrate 200. The pattern on the stamping surface is defined by the regions of chemical differentiation 52, which have chemical affinity for the ink material. By way of non-limiting example, the pattern on the stamp 300 may be formed by conventional techniques, such as by using a mold or by photolithography or e-beam lithography. The pattern on the stamp 300 may also be formed using block copolymers. In one embodiment, the stamp 300 is created lithographically, such as by using, for example, photoresist materials or e-beam resist materials. Referring to FIG. 5, a film 70 may be deposited on the stamp substrate 50. The film 70 may provide the regions of chemical differentiation 52 by using a material for film 70 that has chemical affinity for the ink material. Alternatively, the material used to form the film 70 may be chemically modified to include functional groups having chemical affinity for the ink material. By way of non-limiting example, the film 70 may be formed from gold, an inorganic material, such as silicon dioxide, or a block copolymer.

Figure 6:
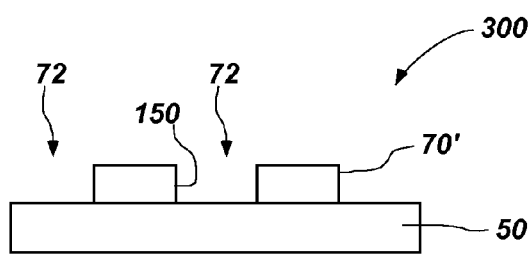

A resist layer 180 may be deposited over the film 70 and patterned by conventional photolithographic or e-beam lithographic techniques, forming openings 72. Photoresist materials, e-beam resist materials and lithographic techniques are well known in the art and, therefore, forming the pattern in the resist layer 180 is not discussed in detail herein. The resist material may be a positive or negative resist and may be an organic or an inorganic material including, but not limited to, polystyrene based resists, poly(meth)acrylate based resists, silsesquioxane materials ("SSQ") and combinations thereof. The resist layer 180 may be formed over the film 70 by a conventional coating technique including, but not limited to, dip coating, bar coating, spin coating, roll coating, spray coating, and flow coating depending on the material used in the resist layer 180. The pattern in the resist layer 180 may be transferred to the film 70 using resist layer 180 as a mask, as known in the art. As shown in FIG. 6, the film 70 may be etched to produce the stamping surface 70' on the stamp substrate 50. While the stamp 300 is illustrated in FIG. 6 as including topographical features, the stamp 300 may be substantially planar. If the material used as film 70 has affinity for the ink material, such as gold, the stamping surface 70' may correspond to regions of chemical differentiation 52. However, if the material used as film 70 does not have affinity for the ink material, the stamping surface 70' may be modified to include a layer of gold or to include functional groups, such as thiol or amine groups, that have affinity for the ink material. The modified stamping surface 70' may correspond to the regions of chemical differentiation 52. By way of non-limiting example, if silicon dioxide or block copolymers are used as the material of film 70, the film 70 may be modified with a layer of gold or with thiol or amine groups to provide the regions of chemical differentiation 52.

Figure 7:
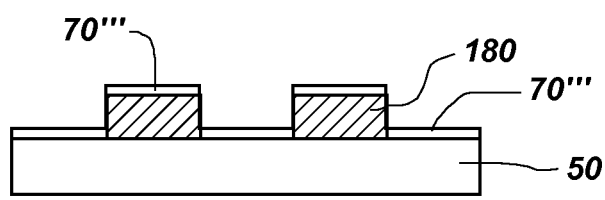
Figure 8:
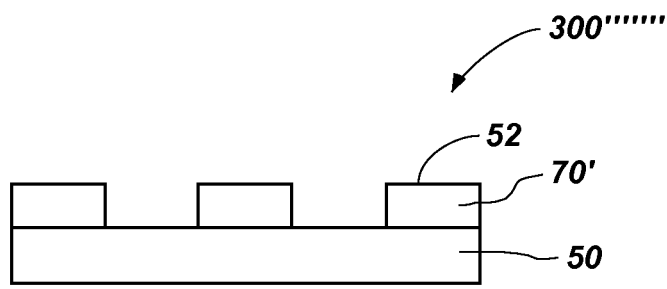

In one embodiment, the regions of chemical differentiation 52 are formed from gold. In other words, gold may be used as the material of film 70 or gold is used to coat another material used as film 70. In one embodiment, E-beam lithography may be used to create the stamp 300 by depositing a resist layer 180 over the stamp substrate 50. The pattern produced in the resist layer 180 may be transferred to the stamp substrate 50 as known in the art. A film 70''' including a chromium layer (75 nm) followed by a layer of gold (5 nm) is deposited over the resist layer 180. Any metals deposited under the gold layer, such as the chromium layer, may have little or no affinity for thiol groups. The chromium layer may be used as an adhesive layer for the gold. Referring to FIGS. 7 and 8, the resist layer 180 and overlying metal (film 70''') may then be removed, such as by ultrasonication for 20 minutes in toluene. The resulting stamp 300'''''' having gold regions of chemical differentiation 52 thereon (corresponding to the stamping surface 70') may be dried, for example, in a nitrogen stream. Since gold has affinity for thiol groups, the stamp 300 may be used with an ink material having thiol functional groups to pattern the receptor substrate 200. The formation of SAMs of ink material or gold regions of chemical differentiation 52 may enable complete or substantially complete patterns of ink material to be formed on the receptor substrate 200, such that a better transfer of the ink material to the receptor substrate 200 may occur relative to the stamps that do not form complete SAMs.

In another embodiment, the film 70 is formed from an inorganic material including, or modified to include, exposed thiol or amine functional groups thereon. By way of non-limiting example, the film 70 may be formed from silicon dioxide and coated with a mercaptopropyl(trialkoxy)silane compound (e.g., CAS Nos. 14814-09-6, 4420-74-0, available from Gelest Inc., Morrisville, Pa.). The coating of the mercaptopropyl(trialkoxy)silane compound may provide exposed thiol groups on the stamp 300, which correspond to the regions of chemical differentiation 52. To form such a stamping surface, a silicon dioxide film may be deposited on the stamp substrate 50 and patterned by conventional techniques to form topographic features. In other words, silicon dioxide may be the material used for film 70. By way of non-limiting example, the silicon oxide film may be patterned by (1) conventional photolithography (i.e., down to 60 nm) of photoresist followed by dry etch; (2) e-beam lithography (down to ~30 nm) of e-beam resist followed by dry etch; (3) graphoepitaxial self-assembly of a block copolymer and removal of one domain to form an etch mask followed by dry etch as further described herein; or (4) pitch multiplication. The silicon oxide film may be a thin coating on the stamp substrate 50. For example, the silicon oxide film may be between about 1-10 nm thick. In one embodiment, the majority of the etch occurs into a separate material that does not react with mercaptopropyl(trialkoxy)silane, such as silicon. This material forms the non-reactive areas around the regions of chemical differentiation 52. The patterned silicon oxide film may then be exposed to the mercaptopropyl(trialkoxy)silane compound so as to form a thiol-containing layer on the surface of the silicon dioxide. In one embodiment, a thiolsilane monolayer may be deposited on the silicon oxide film prior to patterning such that the thiolsilane monolayer survives the etching process (e.g., the thiolsilane monolayer is covered by the resist during patterning) and such that the thiol groups are exclusively on the stamp tips and not on the sides of the topographical features. For example, if the thiolsilane monolayer is deposited over a patterned substrate, the thiolsilane monolayer will likely be deposited on the sidewalls of any topographical features of the stamp and the ink material may be deposited on the sidewalls of the topographical features. However, if the thiolsilane monolayer is deposited prior to patterning, the thiolsilane monolayer, and thus the thiol groups, will be exclusively on the stamp tips.

By way of non-limiting example, the film 70 may be formed from silicon oxide and coated with an aminoalkyl (trialkoxy)silane compound (available from Gelest, Inc., Morrisville, Pa.). The coating of the aminoalkyl(trialkoxy)silane compound may provide exposed amine groups on the stamp 300, which correspond to the regions of chemical differentiation 52. The method of creating the stamp 300 coated with the aminoalkyl(trialkoxy)silane compound may follow the general method described above with respect to the stamp 300 coated with the mercaptopropyl(trialkoxy)silane compound. The patterned silicon oxide film may be exposed to the aminoalkyl(trialkoxy)silane compound to form an amine layer of the silicon oxide film surface. In one embodiment, an aminosilane monolayer is formed on the silicon oxide film prior to patterning such that the aminosilane monolayer survives the etching process to create regions of chemical affinity including amine groups exclusively on the stamp tips and not on the sides of the topographical features.

In another embodiment, the film 70 is formed from a block copolymer. The film 70 formed from the block copolymer may be modified with gold or at least one of thiol and amine functional groups to provide the stamping surface 70', which corresponds to the regions of chemical differentiation 52. In one embodiment, one of the blocks inherently contains a thiol or amine functional group, for example, polyvinylpyridine. When the film 70 on the stamp 300 is formed from a block copolymer, a first block of the block copolymer may be selected, or modified to include, at least one functional group that reacts with a first ink material, while the second block may be inert or, optionally, may include at least one functional group that reacts with a second functional group of a second ink material. Alternatively, or in addition to, the second block may be removed prior to contacting the stamping surface with the ink material. When block copolymers are used for film 70, one domain of the block domain may be selectively removed to form openings 72 as discussed herein. Alternatively, a planar device may be formed wherein one domain lacks affinity for the ink material. Films 70 formed from the block copolymer may self-assemble into periodic structures by microphase separation of the constituent blocks after annealing. Following self-assembly, one block of the block copolymer may be selectively removed, producing a patterned film formed from the remaining block. The patterned film may be used as an etch mask for patterning features onto the underlying substrate. Alternatively, one block of the block copolymer may have chemical affinity for the first ink material while the other block(s) may have chemical affinity for the second ink material. In one embodiment, the stamp is made from a PS-PMMA block copolymer, the ink material is alkynethiol-gold nanoparticles and the receptor substrate is 11-azidoundecyl(trialkokysilane) on $SiO_2$. The alkynethiol gold nanoparticles will selectively absorb to the PS domains of the PS-PMMA block copolymer film by selective wetting of the PS over PMMA by the alkyne tails on the nanoparticles.

Block copolymers are polymers that include at least one long sequence (i.e., "block") of the same monmeric unit(s) covalently bound to at least one long sequence (i.e., "block") of unlike type e.g., including differing monomeric unit(s). Block copolymers are conventionally named using the word "-block-" or "-b-" to separate each monomeric unit, while random copolymers are conventionally named using the term "-random-" or an "-r-" to separate each monomeric unit. A wide variety of block copolymers are contemplated herein including diblock copolymers (copolymers having two blocks), triblock copolymers (copolymers having three blocks), multiblock copolymers (copolymers having more than three blocks), and combinations thereof.

If a diblock copolymer is used as the material of film 70, each block of the block copolymer may differ from other blocks not only in terms of the structure of the monomeric units that form that block, but also in other properties including, for example, physical properties (e.g., mechanical strength, surface tension, wettability, and/or solubility) and chemical properties (e.g., solubility, chemical reactivity, susceptibility to removal techniques and/or susceptibility to cross-linking reactions). Film morphology, including the size and shape of the microphase-separated domains may be controlled by the molecular weight and volume fraction of the blocks in the diblock copolymer. By way of non-limiting example, the ratio of each block of a diblock copolymer is between about 40:60 and about 60:40 to create lamellar domains or alternating stripes of the blocks. Domain sizes of the blocks may be between about 5 nm and about 50 nm. The block copolymer used in creating the stamp 300' may be selected based on their chemical affinity toward the ink material.

By way of non-limiting example, the blocks of the block copolymer may be polybutadiene-polybutylmethcrylate, polybutadiene-polydimethylsiloxane, poly(styrene-b-methyl methacrylate) (PS-b-PMMA), polybutadiene-polymethylmethacrylate, polybutadiene-polyvinylpyridine, polybutylmethacrylate-polybutylacrylate, polybutylmethacrylate-polyvinylpyridine, polybutadienepolyvinylpyridine, polyethyleneoxide-polyisoprene, polyethyleneoxide-polybutadiene, polyethyleneoxide-polystyrene, polyethylene-polyvinylpyridine, polyisoprene-polymethylmethacrylate, polyisoprene-polyvinylpyridine, polybutylacrylate-polymethylmethacrylate, polybutylacrylate-polyvinylpyridine, polyhexylacrylate-polyvinylpyridine, polyisobutylene-polybutylmethacrylate, polyisobutylene-polydimethoxysiloxane, polyisobutylene-polymethylmethacrylate, polyisobutylene-polyvinylpyridine, polyethylene-polymethylmethacrylate, polymethylmathacrylate-polybutylacrylate, polymethylmethacrylate-polybutylmethacrylate, polystyrene-polybutadiene, polystyrene-polybutylacrylate, polystyrene-polybutylmethacrylate, polystyrene-polybutylstyrene, polystyrene-polydimethoxysiloxane, polystyrene-polyvinylpyridine, polyvinylpyridine-polymethylmethacrylate, polystyrene-polyisoprene (PS-b-PI), polystyrene-b-lactic acid, or polyethyleneoxide-polymethylmethacrylate. As described in detail below, the block copolymer may be a diblock copolymer. However, block copolymers having three (a triblock copolymer) or more (a multiblock copolymer) blocks may also be used. Examples of triblock copolymers include, but are not limited to, poly(styrene-block methyl methacrylate-block-ethylene oxide) and block copolymers having three or more blocks selected from the following: polystyrene, polymethylmethacrylate, polyethyleneoxide, polyisoprene, polybutadiene, poly lactic acid, polyvinylpyridine, and combinations thereof.

In one embodiment, the block copolymer is a diblock copolymer. Diblock copolymers may be symmetric (i.e., the volume fraction of the first block is substantially the same as the volume fraction of the second block) or asymmetric (i.e., the volume fraction of the first block is substantially different than the volume fraction of the second block). As used herein, each block of a symmetric diblock copolymer has a volume fraction of from about 0.4 to about 0.6. As used herein, each block of an asymmetric diblock copolymer has a volume fraction less than about 0.4 or greater than about 0.6. In one embodiment, the diblock copolymer is a symmetric diblock copolymer and is used for embodiments in which the diblock copolymer self-assembles to form lamellae (i.e., sheets of material interleaved with another material). Asymmetric diblock copolymers may be used for embodiments in which the diblock copolymer self-assembles to form other morphologies including, for example, spheres, cylinders, gyroids, or combinations thereof. For methods that include a first and a second block copolymer, both the first and the second block copolymers may be symmetric block copolymers.

In one embodiment, the stamp 300 may be created using diblock copolymers, which are applied to the surface of the stamp substrate 50 by any suitable means. Any material, which may permit the diblock copolymer to orient in a substantially perpendicular manner, may be used for the stamp substrate 50. As used herein, "substantially perpendicular" lamellae refers to a set of lamellae that are, on average, perpendicular to the surface. However, other materials may be used for the stamp substrate 50 if the surface of the stamp substrate 50 is treated with a material that may permit the diblock copolymer to orient substantially perpendicularly thereto. Thus, the stamp substrate 50 is not limited to any particular material.

The diblock copolymer may be applied to the stamp substrate 50 by conventional techniques including, for example, deposition methods, coating methods, transfer methods, and/or other available application methods. The diblock copolymer may be applied by spin coating, dip coating, spray coating, and combinations thereof In such methods, the diblock copolymer may be dissolved, dispersed, or suspended in a medium (e.g., a solvent). The solution, dispersion, or suspension may be deposited on the stamp substrate 50, and the medium may be optionally removed (e.g., through evaporation at ambient or elevated temperature, and at ambient or reduced pressure) during or subsequent to deposition.

Depending on the properties of the blocks (e.g., molecular weight, block weight ratio, film thickness) and the process conditions (e.g., annealing conditions, surface treatment and the like), the blocks of the diblock copolymer may microphase separate on a nanometer-scale length scale, forming a hexagonal array of pores in a thin polymer film. Other phase morphologies of the diblock copolymer include, but are not limited to, a spherical phase, a lamellar phase, etc.

Thus, in one embodiment, at least one region of chemical differentiation is formed on a stamp substrate, the at least one region of chemical differentiation exhibiting chemical affinity for at least one ink material. The at least one region of chemical differentiation may include gold, a compound containing at least one thiol functional group or a compound containing at least one amine functional group. The at least one region of chemical differentiation on the stamp substrate may be formed by depositing a block copolymer on the stamp substrate and self-assembling the block copolymer into at least two domains having a perpendicular orientation to the stamp substrate. At least one of the domains of the self-assembled block copolymer may be optionally removed. At least one of the domains may be coated with gold, a compound containing thiol functional groups, a compound containing amine functional groups, or combinations thereof. The at least one region of chemical differentiation may include topographical features.

Figure 9:
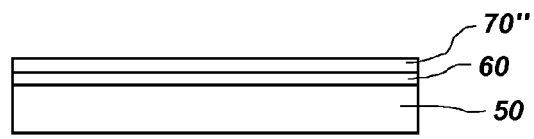

Referring to FIG. 9, the stamp substrate 50 is provided having a neutral wetting surface with respect to each block of the diblock copolymer. As such, no block of the block copolymer preferentially wets the surface of the stamp substrate 50. The stamp substrate 50 may be formed from one of the materials previously described. While the stamp substrate 50 is depicted as being substantially planar, the stamp substrate 50 may be patterned prior to deposition of the diblock copolymer. For example, the stamp substrate 50 may include trenches that serve as guides for the formation of self-assembled block copolymers therein. The trenches may be formed using conventional lithographic techniques or using block copolymers, as described in detail herein. In one embodiment, the stamp substrate 50 is chemically patterned to include a series of chemical regions of about the same size of each block in the block copolymer, which serve as guides for the formation of the self-assembled block copolymers therein. A symmetric diblock copolymer may be deposited on the stamp substrate 50, forming film 70". If the stamp substrate 50 does not have a neutral wetting surface, a material layer 60 may be formed between the stamp substrate 50 and the film 70", providing the neutral wetting surface. While material layer 60 is shown in FIG. 9, this layer is optional.

In one embodiment, the material layer 60 is hydrogen-terminated silicon, which provides the neutral wetting surface for the diblock copolymer polystyrene-b-polymethylmethacrylate. In another embodiment, the material layer 60 includes a random copolymer and may be cross-linked using the same or different methods than used to cross-linking at least one block of the block copolymer. The cross-linked material layer 60 may be used, for example, to render the stamp substrate 50 neutral wetting with respect to each block of the block copolymer, enabling the block copolymer to self-assemble on the stamp substrate 50. For example, if the diblock copolymer is a polystyrene-b-polymethylmethacrylate diblock copolymer, a cross-linkable polystyrene-r-polymethylmethacrylate random copolymer may be used as the material layer 60. The cross-linked material layer 60 is preferably resistant to further processing encountered during the block copolymer self-assembly process.

Once the diblock copolymer is deposited on the stamp substrate 50 (or on the material layer 60), the diblock copolymer may be annealed to break up existing domains and allow the diblock copolymer to self-assemble. The diblock polymer may be annealed by thermal annealing, solvent annealing, or combinations thereof. During the annealing, the diblock polymer may form ordered domains having nanometer-scale dimensions. Thermal annealing may include exposing the diblock copolymer to an elevated temperature (e.g., at or above the glass transition temperature of the diblock copolymer), and lowering the temperature to allow the self-assembled block copolymer to harden. By way of non-limiting example, the diblock polymer may be thermally annealed by heating the diblock copolymer to a temperature of from about 0° C. to about 250° C. for up to about 24 hours or longer, preferably under a vacuum or inert atmosphere. Solvent annealing may include exposing the diblock copolymer to a solvent until the diblock copolymer swells. At least a portion of the solvent may then be removed, such as through evaporation.

Figure 10:
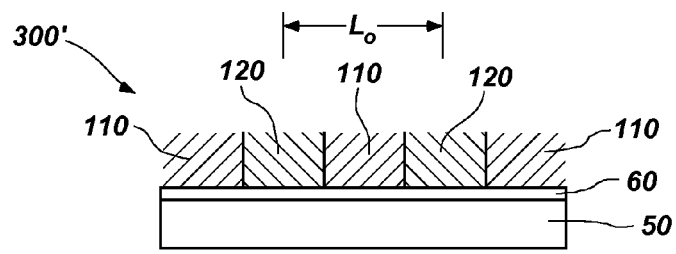

As shown in FIG. 10, each block of the diblock copolymer in the film 70" may self-assemble into a domain during the anneal. Symmetric diblock copolymers self-assemble into lamellar structures in which alternating lamellae each represent a domain including one block of the diblock copolymer. A distance between the middle of a first lamella and the middle of the next lamella of the same type is the inherent periodicity ($L_o$) of the diblock copolymer, which is dependent on the length and/or molecular weight of the polymer chain for each block. Thus, the inherent periodicity of the diblock copolymer may be increased by increasing the length and/or molecular weight of the polymer chain for one or both diblocks of the diblock copolymer. Conversely, the $L_o$ may be decreased by decreasing the length and/or molecular weight of the polymer chain for one or both block of the diblock copolymer. Diblock copolymers contemplated herein may have an $L_o$ from about 10 nm to about 100 nm. For methods that use a first and second block copolymer, the $L_o$ of the first block copolymer may be the same as or different from the $L_o$ of the second block copolymer.

The diblock copolymer in the film 70" self-assembles during the anneal to form a set of alternating lamellae 110 and 120 that are substantially perpendicular to the stamp substrate 50. The lamellae 110, 120 may have differentiated chemical affinities in that lamellae 110 may have affinity for a first ink material while lamellae 120 may be substantially inert or may have affinity for a second ink material. Each block of the diblock copolymer may be selected to provide the desired chemical affinity for the ink material(s), or one or more of the blocks may be modified with a functional group to provide the desired chemical affinity. The upper surface of the lamellae 110, 120, as shown in the stamp 300' of FIG. 10, may correspond to the regions of chemical differentiation 52. Alternatively, if the lamellae 110, 120 do not have chemical affinity for the ink material(s), the upper surface of one of lamellae 110 or 120 may be modified to include gold, thiol groups or amine groups to provide the regions of chemical differentiation 52.

Figure 11:
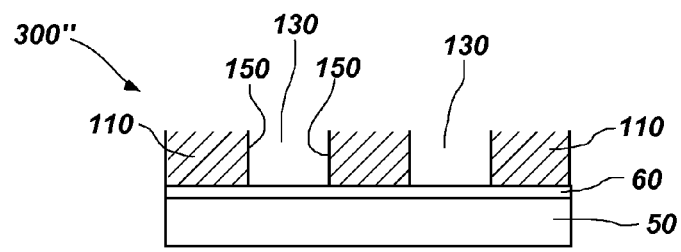

Alternatively, lamellae 120 may be removed to create a pattern on the stamp 300", as shown in FIG. 11. To remove the lamellae 120, lamellae 110 may be cross-linked, for example, by exposure to radiation, e.g., ultraviolet (UV) radiation. Cross-linked lamellae may have, for example, improved mechanical properties and lower susceptibility to removal during further processing. In some embodiments, the block of the block copolymer that forms lamellae 110 may be susceptible to cross-linking without the addition of a cross-linking agent. For example, if the block copolymer is a polystyrene-b-polymethylmethacrylate diblock copolymer, the polystyrene block may be cross-linked by exposure to UV radiation. Alternatively, the block of the block copolymer that forms lamellae 110 may be made cross-linkable by including a small amount (e.g., 1 to 5 mole %) of a thermally cross-linkable monomer (e.g., a benzocyclobutane-containing monomer) or a photochemically cross-linkable monomer (e.g., divinyl benzene or azido-methylstyrene). Alternatively, or in addition to, in some embodiments, the cross-linking agent may be added to the block of the block copolymer that forms lamellae 110. A wide variety of cross-linking agents are known in the art and include, for example, the combination of a cross-linker (e.g., 1,3,5-trimethyl-2,4,6-(triacetoxymethyl)benzene) and a thermal acid generator (e.g., cyclohexylmethyl(2-oxocycicohexyl)sulfonium trifluoromethanesulfonate).

Referring to FIG. 11, the lamellae 120, which are not cross-linked, may be selectively removed, leaving the cross-linked lamellae 110 and voids 130 on the surface of the stamp 300". The voids 130 are defined by sidewalls 150 of the cross-linked lamellae 110. A wide variety of methods for removing uncross-linked lamellae are known in the art including, for example, irradiation (e.g., UV or electron beam), ozone treatment, wet chemical processing methods, such as immersion in a solvent, and/or etching methods such as reactive ion etching and ion beam etching. For example, when the diblock copolymer is polystyrene-b-polymethylmethacrylate diblock copolymer and the lamellae including the polystyrene blocks are cross-linked, the lamellae including the uncross-linked polymethylmethacrylate block may be selectively removed, for example, by acetic acid development after a blanket exposure to ultraviolet (UV) radiation. The resulting stamp 300" may be used for printing or may be subjected to further processing, for example, wherein the stamp 300" functions as a mask.

Figure 12:
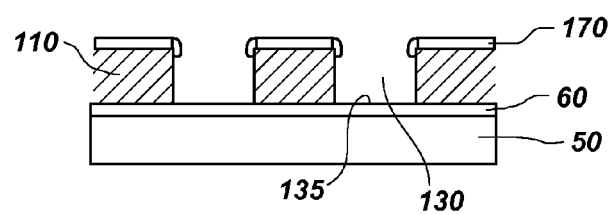
Figure 13:
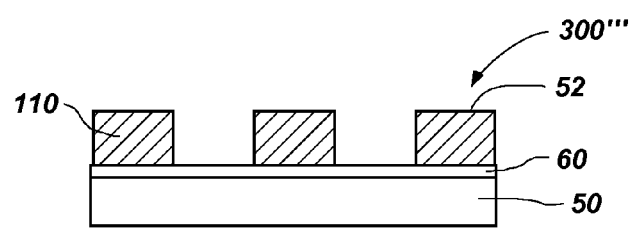

In one embodiment, depicted in FIG. 12, material 170 may be selectively deposited over the cross-linked lamellae 110. The material 170 may have a different etch selectivity than lamellae 110. By way of non-limiting example, the material 170 may be gold that is deposited using a grazing angle deposition. Gold may be sputtered onto the surface at an angle of a few degrees above parallel to the stamping substrate 50. The gold will be deposited above lamellae 110 and to a small extent within voids 130 at the top of the sidewalls. However, the bottom surface 135 of voids 130 will be largely protected from gold deposition by the adjacent lamellae 110 and a stamp 300''' including gold regions of chemical differentiation 52 on the cross-linked lamellae 110 may be formed. (FIG. 13).

Figure 14:
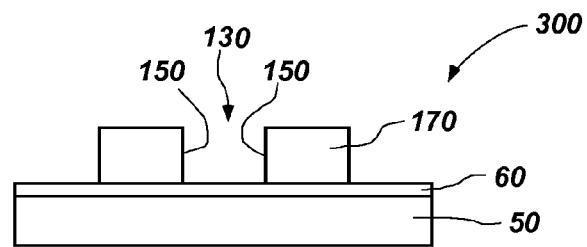

The cross-linked lamellae 110 of the stamp 300" may also be used as a mask for further processing. For example, the voids 130 may be filled with a material prior to stamping the receptor substrate 200. Referring to FIG. 12, material 170 may be deposited within the voids 130 and over the cross-linked lamellae 110. The material 170 may have a different etch selectivity than lamellae 110. For example, the material 170 may be an inorganic material, such as silicon dioxide or gold. The material 170 may be planarized, exposing the top surface of lamellae 110. The lamellae 110 may be selectively removed, leaving a pattern of the material 170 on the stamp substrate 50 and voids 130, as shown in FIG. 14. If material 170 does not create regions of chemical differentiation upon stamping substrate 50, an inorganic material such as gold may be deposited on the top surfaces of the material 170 or the top surfaces of the material 170 may be modified prior to selective etching of lamellae 110 to include thiol or amine functional groups, forming regions of chemical differentiation 52 on the material 170.

Figure 15:
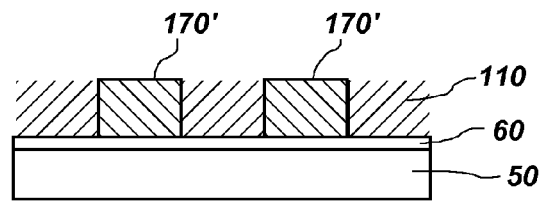
Figure 16:
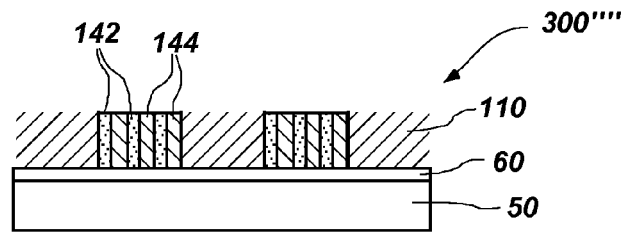

In another embodiment, the voids 130 of FIG. 11 may form trenches that serve as guides for self-assembly of the block copolymers. However, in the alternative, trenches may be formed by conventional lithography and used as guides for the self-assembly of the block copolymers. Referring to FIG. 15, a second block copolymer 170', which may be the same as or different than the block copolymer used in film 70", may be deposited in the voids 130. In one embodiment, the voids 130 have a bottom surface (an exposed surface of the stamp substrate 50) that is neutral wetting with respect to each block of the second block copolymer 170'. However, if the voids 130 do not include a neutral wetting surface, the material layer 60 may, optionally, be deposited therein to render the stamp substrate 50 surface neutral wetting, as previously described. The sidewalls 150 may be wetted by at least one block of the second block copolymer 170' (e.g., one block of the second block copolymer 170' is similar to, or the same as, the cross-linked block of the lamellae 110). The second block copolymer 170' may be annealed, by methods such as those previously described, to allow self-assembly within each void 130 to form a second set of alternating lamellae 142 and 144, as shown in FIG. 16. The lamellae 142, 144 may be oriented substantially perpendicular to the stamp substrate 50 and substantially in register with each sidewall 150, forming stamp 300''''.

Figure 17:
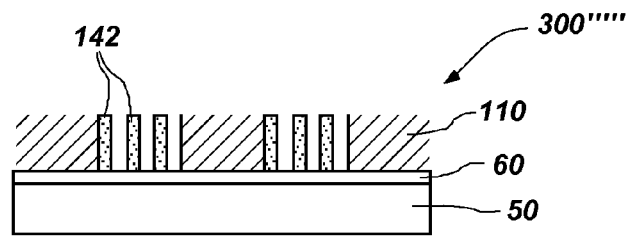

Optionally, lamellae 142 may be cross-linked by methods such as those previously described. Referring to FIGS. 16 and 17, uncross-linked lamellae 144 may be removed by methods such as those previously described, forming a pattern of lamellae 142. The resulting pattern may be used, for example, as an etch mask to form sub-lithographic openings in the stamp substrate 50. As used herein, the term "sub-lithographic" means and includes having one or more sizes or dimensions that are less than the minimum sizes or dimensions obtainable using conventional lithography. Alternatively, the pattern may form stamp 300'''''. The stamps 300'''''', 300''''' shown in FIGS. 16 and 17 may be used for patterning the receptor substrate 200, provided that two of lamellae 110, 142 and 144, as shown in FIG. 16, have chemical affinity for the desired ink material. For example, with respect to FIG. 16, if each of lamellae 110, 142 and 144 have chemical affinity for the ink material, the ink material may bind to all three regions and no pattern would be transferred to the receptor substrate 200. However, if two of lamellae 110, 142 and 144 have chemical affinity for the ink material, the ink material may bind to these two regions, forming a pattern, which may be transferred to the receptor substrate 200. The lamellae 110, 142 shown in FIG. 17 may have chemical affinity for the same ink material or the lamellae 110, 142 may have chemical affinity for different ink materials.

Figure 18:
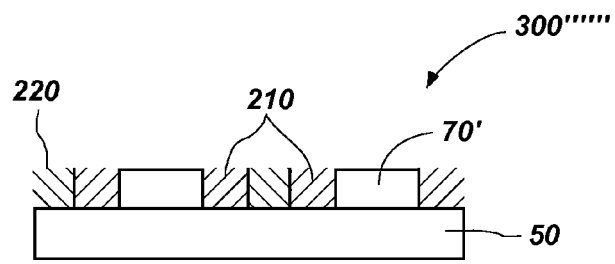

In one embodiment, the diblock copolymer is used with the stamp of FIG. 6 by depositing the diblock copolymer within openings 72 formed by film 70. The diblock copolymer is annealed, forming alternating lamellae 210, 220 that are substantially perpendicular to the stamp substrate 50 of the stamp 300'''''. (FIG. 18). The lamellae 210, 220 may provide regions of chemical differentiation in addition to those that are provided by film 70'. Or, if the lamellae in the openings 72 do not include chemical affinity for the ink materials, the upper surface thereof may be modified to include gold, thiol groups or amine groups to provide the additional regions of chemical differentiation. Alternatively, one of the sets of lamellae in the openings 72 may be cross-linked and removed, by methods such as those previously described, forming a desired pattern in the openings 72. In this embodiment, film 70 is a silicon-containing layer such that film 70 has silicon-containing sidewalls 150. The film 70 may be formed from silicon dioxide ($SiO_2$), silicon nitride ($Si_3N_4$), SSQ, Si, SiOC, SiON or combinations thereof. Optionally, a homopolymer of one block of the diblock copolymer may be grafted to the silicon-containing sidewalls 150 so that openings 72 may be preferentially wetted by the same block of the diblock copolymer. For example, if the diblock copolymer to be self-assembled in the openings 72 is a polystyrene-b-polymethylmethacrylate diblock copolymer, a polystyrene homopolymer may be grafted to the silicon-containing sidewalls 150 so that the openings 72 may be wetted by the polystyrene block of the diblock copolymer. Alternatively, a polymethylmethacrylate homopolymer may be grafted to the silicon-containing sidewalls 150 so that openings 72 may be preferentially wetted by the polymethylmethacrylate block of the diblock copolymer. The homopolymers may be grafted by a wide variety of methods known in the art including, for example, preparing homopolymers with end groups (e.g., hydroxyl groups) that may interact (e.g., by forming hydrogen and/or covalent bonds) with the silicon-containing sidewalls.

Figure 19:
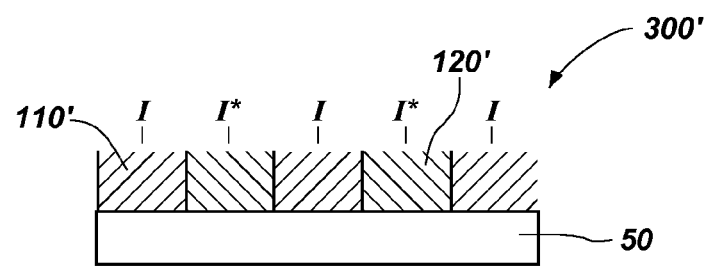
FIG. 19 is a cross-sectional view of an embodiment of a stamp of the present invention including self-assembled block copolymer domains.

If the stamp (such as, for example, stamps 300', 300'', 300''', 300'''') has chemical affinity for more than one ink material, the first and second blocks of the diblock copolymer in these stamps provide regions of chemical differentiation that react with the first and second ink materials, respectively. The first and second blocks of the diblock copolymer in these stamps form separate domains having sizes and morphologies that correspond to the stamp pattern. The first block of the diblock copolymer is selected, or modified to include, a functional group that reacts with the first ink material and the second block is selected, or modified to include, a functional group that reacts with the second ink material. The diblock copolymer may then be annealed, by methods such as those previously described, producing the two domains. Referring to FIG. 19, the stamp substrate 50 includes thereon a first domain 110' selective to "I" (the first ink material) and a second domain 120' selective to "I*" (the second ink material). The stamps 300', 300'', 300''', 300'''' may be used to pattern the receptor substrate 200 with the first and second ink materials. While use of two ink materials is shown with respect to stamps 300', 300'', 300''', 300'''', the use of more than two ink materials may be contemplated if the stamp includes more than two distinct regions of chemical differentiation. The first and second ink material may be applied to the stamps during the same printing process or during a separate printing process.

By way of non-limiting example, combinations of materials used as the regions of chemical differentiation of the stamp, the ink material and the receptor substrate are described herein. However, the stamp, ink material or receptor substrate, may be formed from other materials and may include other combinations of materials, as previously described. For example, the stamp may include gold regions of chemical differentiation and interact with the ink material via a gold-thiol bond. In an embodiment where the stamp includes $SiO_2$ topographic features coated with a mercaptopropyl(trialkoxy)silane compound, the ink material may interact with the stamping surface via disulfide bonds. A disulfide bond is relatively weak (between about 50 Kcal/mol and about 60 Kcal/mol). The ink material may include a free thiol (R—SH) functional group, in which case an oxidant, such as bromine, may be used to form the disulfide linkage to the regions of chemical differentiation on the stamp. Alternatively, the ink material may be present in excess in an oxidized dithiol form R—S—S—R, and a thiol-disulfide rearrangement reaction may be used to transfer the ink material to the stamp, according to the following reaction:

Stamp-$SiO_2$-propyl—SH+R—S—S—R→Stamp-$SiO_2$-propyl—S—S—R+HS—R

When the stamp includes gold regions of chemical differentiation or mercaptopropyl(trialkoxy)silane coated regions of chemical differentiation, amines may be present in the ink material and may be employed to bond the receptor substrate and the ink material. The receptor substrate may be a $SiO_2$ receptor substrate grafted with a glycidoxypropyl(trialkoxy) silane compound (e.g., CAS Nos. 2602-34-8 and 2530-83-8 available from Gelest, Inc., Morrisville, PA), and the ink material may include 2-aminoethanethiol, aminothiophenol, cysteine, homocysteine, leucinethiol, 2-butylaminoethanethiol, or 2-cyclohexylaminoethanethiol (all available from Sigma-Aldrich, Inc., St. Louis, Mo.). In one embodiment, using urethane/urea chemistry, the receptor substrate may be $SiO_2$ grafted with a isocyanatopropyl(trialkoxy)silane compound (available from Gelest, Inc., Morrisville, Pa.) and the ink material may be 2-aminoethanethiol, aminothiophenol, cysteine, homocysteine, leucinethiol, 2-butylaminoethanethiol, or 2-cyclohexylaminoethanethiol (all available from Sigma-Aldrich, Inc., St. Louis, Mo.). The receptor substrate and the ink material may react to form urea linkers. Additionally, any mercapto alcohol, e.g., 2-mercaptoethanol (HS—$CH_2CH_2OH$) or 4-mercapto-1-butanol, may be used to form urethane linkers.

In one embodiment, Huisgens-1,3-dipolar cycloaddition may be employed using a $SiO_2$ receptor substrate grafted with 6-azidosulfonylhexyl (triethoxy)silane or 11-azidoundecyl group monolayers formed by grafting 11-bromoundecyl(triethoxy)silane (available from Gelest) to SiO2, then derivatizing with sodium azide (available from Gelest, Inc., Morrisville, Pa.). The ink material may be an acetylenic thiol and may be prepared, for example, by reaction of 1,4-butanedithiol or 1,2-ethanethiol with 0.5 eq. of propargyl bromide to yield an acetylenic thiol (single thiol unit) or reacting a aminethanethiol with propidic anhydride to make N-(2-mercaptoethyl) propanolamide.

Nucleophilic attack on a Si—Cl surface is another chemistry that may be used to bond the receptor substrate and the ink material. The receptor substrate may be Si—Cl, which is formed from H-terminated silicon via $Cl_2$ gas exposure at 80° C. or $Cl_2$ gas exposure with illumination with a tungsten lamp. The ink material may include 2-aminoethanethiol, aminothiophenol, cysteine, homocysteine, leucinethiol, 2-butylaminoethanethiol, or 2-cyclohexylaminoethanethiol (all available from Sigma-Aldrich, Inc., St. Louis, Mo.) or any mercapto alcohol, e.g., 2-mercaptoethanol (HS—$CH_2CH_2OH$) or 4-mercapto-1-butanol.

Another embodiment of the ink material/receptor substrate that may be used with the stamp having gold regions or mercaptopropyl(trialkoxy)silane coated regions of chemical differentiation utilizes nitrene insertion. The receptor substrate may be $SiO_2$ grafted with 6-azidosulfonylhexyl (triethoxy)silane available from Gelest, Inc., Morrisville, Pa. or SiO2 grafted with an azidoalkly as described herein. The ink material may be an aliphatic or aromatic thiol. The azido group on the surface of the receptor substrate may decompose to a nitrene above 110° C. and the nitrene may react with proximate functional groups of the ink material.

In one embodiment, the stamp may utilize an acid-base interaction with the ink material and the stamp may be formed of $SiO_2$ topographic features coated with material to create exposed amine groups, such as an aminoalkyl(trialkoxy)silane compound. When urethane bonding is utilized, the receptor substrate may be $SiO_2$ grafted with an isocyanatopropyl(trialkoxy)silane available from Gelest, Inc., Morrisville, Pa. The ink material may be, for example, lactic acid, hydroxybutyric acid, hydroxyisocaproic acid, hydroxyisophthallic acid, 8-hydroxy-7-iodo-5-quinolinesulfonic acid, hydroxymandelic acid, hydroxymethanesulfinic acid, hydroxybenzoic acids, hydroxynapthalenesulfonic acid, hydroxypentadecanoic acid, or hydroxyundecanoic acid.

Huisgens-1,3-dipolar cycloaddition may also be utilized with the stamp having aminoalkyl(trialkoxy)silane regions of chemical differentiation thereon. The receptor substrate may be $SiO_2$ grafted with 6-azidosulfonylhexyl (triethoxy)silane available from Gelest, Inc or derivatized with an azidoalkyl as known in the art. The ink material may be any acetylenic carboxylate or sulfonate, e.g., propiolic acid, 4-butynoic acid, 5-pentynoic acid, etc.

Using nucleophilic attack on Si—Cl surface, the receptor substrate may be Si—Cl, which is formed as previously described. The ink material may be, by way of non-limiting example, lactic acid, hydroxybutyric acid, hydroxyisocaproic acid, hydroxyisophthallic acid, 8-hydroxy-7-iodo-5-quinolinesulfonic acid, hydroxymandelic acid, hydroxymethanesulfinic acid, hydroxybenzoic acids, hydroxynapthalenesulfonic acid, hydroxypentadecanoic acid, or hydroxyundecanoic acid.

Nitrene insertion may also be utilized with a stamp having aminoalkyl(trialkoxy)silane regions of chemical differentiation thereon. The receptor substrate may be $SiO_2$ grafted with 6-azidosulfonylhexyl (triethoxy)silane available from Gelest, Inc., Morrisville, Pa. or with an azidoalkyl, and the ink material may be any aliphatic or aromatic thiol moiety.

The stamp (300-300''''') produced by any of the above-mentioned embodiments may be used to pattern the receptor substrate 200, such as by nanocontact chemical printing. By way of non-limiting example, the stamp may be used to print SAMs on a surface of the receptor substrate 200. The pattern on the receptor substrate 200 may have identical, or substantially identical, resolution to the pattern on the stamp. In some embodiments, the pattern on the stamp may be used to produce features on the receptor substrate 200 that are sub-lithographic. By way of non-limiting example, the pattern on the stamp may have a pitch of between about 10 nm and about 100 nm, producing features between about 5 nm and about 50 nm on the receptor substrate 200. In another embodiment, the pattern on the stamp is about 14 nm or less, producing features on the receptor substrate 200 having a size of about 14 nm or less.

Figure 20A:
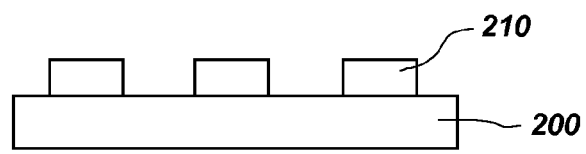
FIGS. 20A, 20B and 20C are cross-sectional views of an embodiment of a receptor substrate including self-assembled monolayers thereon.

As illustrated in FIG. 20A, the pattern formed on the receptor substrate 200 may be a first SAM 210. The ink material deposited on the receptor substrate 200 by the stamp may form the first SAM 210 that corresponds to the pattern on the stamping surface, thus providing a differentiated pattern on the receptor substrate 200. The first SAM 210 may have a thickness of less than about 20 Å (2 nm), which is affected by the selection of the ink material and, in particular, the spacer thereof. By way of non-limiting example, the first SAM 210 has a lateral width less than about 60 nm. In one embodiment, the first SAM 210 has a lateral width of about 14 nm. It will be understood that the lateral width of the SAMs corresponds to the feature size of the stamping surface. After the receptor substrate 200 is patterned, further processing may proceed as desired. Conventional techniques, which are not described in detail herein, may be used to produce a semiconductor structure that includes the receptor substrate 200 and the first SAM 210. By way of non-limiting example, portions of the receptor substrate 200 adjacent the first SAM 210 may remain free of the ink material that produces the first SAM 210. These exposed portions of the receptor substrate 200 may be subjected to further etching or plating. For example, the first SAM 210 may be used as an etch mask on the receptor substrate 200 or may be used to guide selective deposition on the receptor substrate 200. If desired, the first SAM 210 may also be used to direct vapor deposition. Thus, oxide, for example, may be selectively deposited on portions of the receptor substrate 200 lacking the first SAM 210. Alternatively, or in addition to, material may be deposited exclusively on the first SAM 210 or exclusively on portions of the receptor substrate 200 lacking the first SAM 210.

Figure 20B:
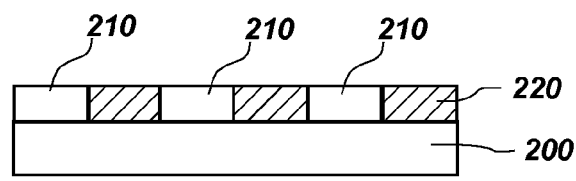
Figure 20C:
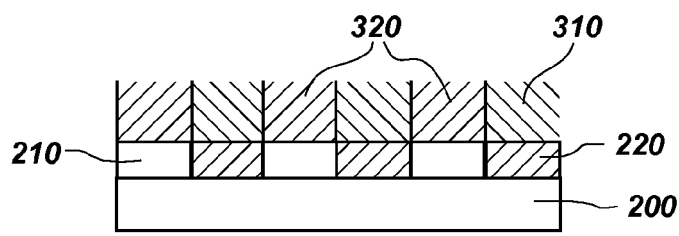

The receptor substrate 200 may also be treated with a second ink material that is chemically distinct from the first ink material used to form the first SAM 210, creating a second SAM 220 thereon, as shown in FIG. 20B. The second ink material may be one of the ink materials described herein. A block copolymer with domains selective to the first SAM 210 and second SAM 220, respectively, and with domain sizes and morphologies that match stamp pattern may be deposited over the first SAM 210 and the second SAM 220. Deposition and self-assembly of this diblock copolymer may proceed as previously discussed to form a second set of alternating lamellae 310 and 320 that are substantially perpendicular to the surface of the receptor substrate, as shown in FIG. 20C. Further processing may proceed as described herein. For example, one of the lamellae 310, 320 may be removed and used as either an etch mask or a mask to guide deposition of further materials.

Thus, the SAMs 210, 220 patterned on the receptor substrate 200 may be used for guiding selective deposition of materials and for chemical patterning of block copolymers cast onto it, which may in turn serve as etch masks. While the latter application may seem redundant given that the stamp may have been prepared using block copolymers, the advantage is that lithographic definition of features will be required for the stamp, whereas multiple patterned receptor substrates may be prepared from a single stamp without further lithography. For example, patterning a substrate using conventional lithographically and/or sub-lithographic techniques has been hampered by difficulties including, for example, high costs and/or incompatibility with high throughput production methods. Further, the self-assembly of block copolymers to an underlying chemical pattern is rapid relative to other methods of "top-down" (i.e., graphoepitaxy) ordering and registration. Thus, even though, in some embodiments, a stamp may be prepared using conventional lithography, because the stamp may be used to pattern multiple substrates, the production cost per substrate is reduced and the rate of formation of block copolymers on the receptor substrate is greatly reduced.

While the invention is susceptible to various modifications as well as additional forms and implementations, specific embodiments have been shown by way of example in the drawings and have been described in detail herein. However, it should be understood that the invention is not limited to the particular embodiments disclosed. Rather, the invention encompasses all modifications, equivalents, and alternatives falling within the spirit and scope of the invention as defined by the following appended claims.

What is claimed is:

1. A stamp, comprising:
self-assembled block copolymer material on a surface of a stamp substrate, the self-assembled block copolymer material comprising alternating lamellae perpendicular to the surface of the stamp substrate, one lamella of the alternating lamellae comprising a first block of the self-assembled block copolymer material and another lamella of the alternating lamellae comprising a second block of the self-assembled block copolymer material;
a first ink material on the first block of the self-assembled block copolymer material, the first ink material including a first functional group configured to bind to the first block of the self-assembled block copolymer material, a second functional group configured to bind to a first region on a receptor substrate, and a spacer molecule linking the first functional group and the second functional group; and a second ink material on the second block of the self-assembled block copolymer material, the second ink material including a third functional group configured to bind to the second block of the self-assembled block copolymer material, a fourth functional group configured to bind to a second region on the receptor substrate, and a spacer molecule linking the third functional group and the fourth functional group.

2. The stamp of claim 1, wherein the first block of the self-assembled block copolymer material comprises the first block of the self-assembled block copolymer material and gold, the first block of the self-assembled block copolymer material and a compound containing at least one thiol functional group, the first block of the self-assembled block copolymer material and a compound containing at least one amine functional group, or combinations thereof.

3. The stamp of claim 1, wherein the first ink material is chemisorbed to the first block of the self-assembled block copolymer material.

4. A method of forming a stamp, comprising:

annealing a diblock copolymer on a stamp substrate to form a self-assembled block copolymer material on a surface of a stamp substrate, the self-assembled block copolymer material comprising alternating lamellae perpendicular to the surface of the stamp substrate, one lamella of the alternating lamellae comprising a first block of the self-assembled block copolymer material and another lamella of the alternating lamellae comprising a second block of the self-assembled block copolymer material, the first block of the self-assembled block copolymer material exhibiting chemical affinity for a first ink material and the second block of the self-assembled block copolymer material exhibiting chemical affinity for a second ink material;

selecting a first ink material comprising an acetylenic sulfonate and including a first functional group configured to bind to the first block of the self-assembled block copolymer material, a second functional group configured to bind to a first region on a receptor substrate, and a spacer molecule linking the first functional group and the second functional group; and selecting a second ink material comprising a third functional group configured to bind to the second block of the self-assembled block copolymer material, a fourth functional group configured to bind to a second region on the receptor substrate and a spacer molecule linking the third functional group and the fourth functional group.

5. The stamp of claim 1, wherein the first block of the self-assembled block copolymer material comprises gold and a chromium material disposed between the stamp substrate and the gold.

6. The stamp of claim 1, wherein the stamp substrate includes a topographical feature.

7. The stamp of claim 6, wherein the first block of the self-assembled block copolymer material is on a tip of the topographical feature.

* * * * *

UNITED STATES PATENT AND TRADEMARK OFFICE
CERTIFICATE OF CORRECTION

| | | |
|---|---|---|
| PATENT NO. | : 8,956,713 B2 | Page 1 of 1 |
| APPLICATION NO. | : 13/157838 | |
| DATED | : February 17, 2015 | |
| INVENTOR(S) | : Dan B. Millward | |

It is certified that error appears in the above-identified patent and that said Letters Patent is hereby corrected as shown below:

In the claims,

In column 22, line 55, in Claim 1, before "self-assembled" insert -- a --.

Signed and Sealed this
Fifth Day of May, 2015

Michelle K. Lee
*Director of the United States Patent and Trademark Office*